United States Patent
Linderman

(10) Patent No.: US 9,911,882 B2
(45) Date of Patent: Mar. 6, 2018

(54) PASSIVE FLOW ACCELERATOR

(75) Inventor: Ryan Linderman, Oakland, CA (US)

(73) Assignee: SUNPOWER CORPORATION, San Jose, CA (US)

( * ) Notice: Subject to any disclaimer, the term of this patent is extended or adjusted under 35 U.S.C. 154(b) by 1274 days.

(21) Appl. No.: 12/822,893

(22) Filed: Jun. 24, 2010

(65) Prior Publication Data

US 2011/0315193 A1   Dec. 29, 2011

(51) Int. Cl.
*H01L 31/024* (2014.01)
*H01L 31/048* (2014.01)
(Continued)

(52) U.S. Cl.
CPC .......... *H01L 31/054* (2014.12); *F24J 2/541* (2013.01); *H01L 31/024* (2013.01); *H01L 31/048* (2013.01); *H01L 31/052* (2013.01); *H01L 31/0521* (2013.01); *H01L 31/0525* (2013.01); *H01L 31/0547* (2014.12); *H02S 20/00* (2013.01); *F24J 2/1047* (2013.01); *F24J 2002/108* (2013.01); *F28F 13/08* (2013.01); *Y02E 10/47* (2013.01); *Y02E 10/52* (2013.01); *Y10T 29/49355* (2015.01)

(58) Field of Classification Search
CPC . H01L 31/0525; H01L 31/058; H01L 23/373; H01L 31/024; H01L 31/048; H01L 31/0522; H01L 31/0524; H01L 31/052; H01L 31/054
USPC .......................................... 136/246; 257/722
See application file for complete search history.

(56) References Cited

U.S. PATENT DOCUMENTS

| 4,153,474 A | 5/1979 | Rex |
| 4,323,719 A | 4/1982 | Green |

(Continued)

FOREIGN PATENT DOCUMENTS

| DE | 10041271 | 3/2002 |
| DE | 202004005198 | 8/2004 |

(Continued)

OTHER PUBLICATIONS

International Search Report and Written Opinion of PCT/US2011/041182, filed Jun. 21, 2011.

(Continued)

*Primary Examiner* — Lindsey Bernier
(74) *Attorney, Agent, or Firm* — Oblon, McClelland, Maier & Neustadt, L.L.P.

(57) ABSTRACT

Methods and apparatuses to increase a speed of airflow through a heat exchanger are described. An optoelectronic device comprising a heat exchanger is coupled to an airflow accelerator. The airflow accelerator comprises a surface to guide the airflow towards the heat exchanger. An optical element is coupled to concentrate light onto the optoelectronic device. The size of the surface, position of the airflow accelerator relative to the heat exchanger, or both can determine increase in speed of the airflow. A photovoltaic ("PV") system comprises rows of receivers; rows of optical elements to concentrate light onto the receivers, and rows of airflow accelerators coupled to the receivers to increase the speed of airflow through heat exchangers. The airflow can be deflected by an airflow accelerator towards a heat exchanger. A wind load can be reduced by the airflow accelerator.

26 Claims, 15 Drawing Sheets

(51) Int. Cl.
| | |
|---|---|
| H01L 31/0525 | (2014.01) |
| H01L 31/052 | (2014.01) |
| H01L 31/054 | (2014.01) |
| F24J 2/54 | (2006.01) |
| H02S 20/00 | (2014.01) |
| F24J 2/10 | (2006.01) |
| F28F 13/08 | (2006.01) |

(56) References Cited

U.S. PATENT DOCUMENTS

| | | | |
|---|---|---|---|
| 4,373,783 | A | 2/1983 | Anderson |
| 4,456,332 | A | 6/1984 | Anderson |
| 4,468,848 | A | 9/1984 | Anderson et al. |
| 4,468,849 | A | 9/1984 | Anderson et al. |
| 4,481,378 | A | 11/1984 | Lesk |
| 4,502,200 | A | 3/1985 | Anderson et al. |
| 4,640,734 | A | 2/1987 | Roberts et al. |
| 4,643,543 | A | 2/1987 | Mohn et al. |
| 4,643,544 | A | 12/1987 | Loughran |
| 4,759,803 | A | 7/1988 | Cohen |
| 5,180,441 | A | 1/1993 | Cornwall et al. |
| 5,248,346 | A | 9/1993 | Fraas et al. |
| 5,334,496 | A | 8/1994 | Pond et al. |
| 5,344,496 | A | 9/1994 | Stern et al. |
| 5,389,158 | A | 2/1995 | Fraas et al. |
| 5,409,549 | A | 4/1995 | Mori |
| 5,498,297 | A | 3/1996 | O'Neill et al. |
| 5,580,395 | A | 12/1996 | Yoshioka et al. |
| 5,616,185 | A | 4/1997 | Kukulka |
| 5,660,644 | A | 8/1997 | Clemens |
| 5,697,192 | A | 12/1997 | Inoue |
| 5,865,905 | A | 2/1999 | Clemens |
| 5,899,199 | A | 5/1999 | Mills |
| 5,990,415 | A | 11/1999 | Green et al. |
| 6,034,322 | A | 3/2000 | Pollard |
| 6,131,565 | A | 10/2000 | Mills |
| 6,323,478 | B1 | 11/2001 | Fujisaki et al. |
| 6,359,209 | B1 | 3/2002 | Glenn et al. |
| 6,442,937 | B1 | 9/2002 | Stone |
| 6,553,729 | B1 | 4/2003 | Nath et al. |
| 6,635,507 | B1 | 10/2003 | Boutros et al. |
| 7,468,485 | B1 | 12/2008 | Swanson |
| 7,554,031 | B2 | 6/2009 | Swanson et al. |
| 7,709,730 | B2 | 5/2010 | Johnson et al. |
| 7,820,906 | B2 | 10/2010 | Johnson et al. |
| 7,825,327 | B2 | 11/2010 | Johnson et al. |
| 7,952,057 | B2 | 5/2011 | Johnson et al. |
| 7,968,791 | B2 | 6/2011 | Do et al. |
| 8,049,150 | B2 | 11/2011 | Johnson et al. |
| 8,083,362 | B2 | 12/2011 | Finot et al. |
| 2002/0074034 | A1* | 6/2002 | Fujisaki et al. ............... 136/246 |
| 2004/0074490 | A1 | 4/2004 | Mills et al. |
| 2005/0061311 | A1 | 3/2005 | Christensen |
| 2005/0081909 | A1* | 4/2005 | Paull ............................ 136/246 |
| 2007/0151598 | A1 | 7/2007 | De Ceuster et al. |
| 2007/0257274 | A1 | 11/2007 | Martter et al. |
| 2008/0035198 | A1 | 2/2008 | Teppe et al. |
| 2008/0245402 | A1 | 10/2008 | Romeo |
| 2008/0251113 | A1* | 10/2008 | Horne et al. ................. 136/246 |
| 2009/0056698 | A1 | 3/2009 | Johnson et al. |
| 2009/0056699 | A1 | 3/2009 | Mills et al. |
| 2009/0056785 | A1 | 3/2009 | Johnson et al. |
| 2009/0056786 | A1 | 3/2009 | Johnson et al. |
| 2009/0056787 | A1 | 3/2009 | Johnson et al. |
| 2009/0095284 | A1 | 4/2009 | Klotz |
| 2009/0139557 | A1 | 6/2009 | Rose et al. |
| 2009/0173375 | A1 | 7/2009 | Frazier et al. |
| 2010/0154788 | A1 | 6/2010 | Wells et al. |
| 2010/0163014 | A1 | 7/2010 | Johnson et al. |
| 2010/0175740 | A1 | 7/2010 | Johnson et al. |
| 2010/0193014 | A1 | 8/2010 | Johnson et al. |
| 2010/0236626 | A1 | 9/2010 | Finot et al. |
| 2010/0294336 | A1 | 11/2010 | Johnson et al. |
| 2010/0319682 | A1 | 12/2010 | Klotz |
| 2011/0023940 | A1 | 2/2011 | Do et al. |
| 2011/0120524 | A1* | 5/2011 | Wares et al. .................. 136/246 |
| 2011/0132457 | A1 | 6/2011 | Finot |
| 2011/0186130 | A1 | 8/2011 | Finot et al. |
| 2011/0226309 | A1 | 9/2011 | Do et al. |
| 2011/0226310 | A1 | 9/2011 | Johnson et al. |
| 2011/0265869 | A1 | 11/2011 | Finot et al. |

FOREIGN PATENT DOCUMENTS

| | | |
|---|---|---|
| GB | 2340993 | 3/2000 |
| JP | 2007184542 | 7/2007 |
| JP | 2007194521 | 8/2007 |
| JP | 2007214247 | 8/2007 |
| KR | 1020070070183 | 7/2007 |
| KR | 1020090014153 | 2/2009 |
| WO | WO1999057493 | 11/1999 |
| WO | WO-2007/096158 A1 | 8/2007 |
| WO | WO2007096157 | 8/2007 |
| WO | WO-2008/022409 A1 | 2/2008 |
| WO | WO-2008/153922 A1 | 12/2008 |
| WO | WO-2009/023063 A2 | 2/2009 |
| WO | WO-2009/029275 A2 | 3/2009 |
| WO | WO-2009/029277 A2 | 3/2009 |

OTHER PUBLICATIONS

Bardwell, Karen et al., "Minimizing End Shadowing Effects on Parabolic Concentrator Arrays," IEEE, 1980, pp. 765-770.

Carroll, Don et al. "Production of the Alpha Solarco Proof-of-Concept Array," IEEE, 1990, pp. 1136-1141.

Edenburn, Michael W., et al. "Shading Analysis of a Photovoltaic Cell String Illuminated by a Parabolic Trough Concentrator," IEEE, 1981, pp. 63-68.

Quagan, Robert J., "Laser Diode Heat Spreaders," Ion Beam Milling, Inc., website copyright 2010, http://www.ionbeammilling.com/default.asp, 9 pgs.

Shepard, Jr., N. F. et al., "The Integration of Bypass Diodes with Terrestrial Photovoltaic Modules and Arrays," IEEE, 1984, pp. 676-681.

Stern, T. G., "Interim results of the SLATS concentrator experiment on LIPS-II (space vehicle power plants)," Photovoltaic Specialists Conference, 1988., Conference Record of the Twentieth IEEE , vol., no., pp. 837-840 vol. 2, 1988. URL: http://ieeexplore.ieee.org/stamp/stamp.jsp?tp=&arnumber=105822&isnumber=3239.

Vivar Garcia, Marta, "Optimisation of the Euclides Photovoltaic Concentrator," 2009, 390 pages.

* cited by examiner

1500

```
COUPLING ONE OR MORE OPTICAL
ELEMENTS TO THE OPTOELECTRONIC DEVICES
1501
```

```
COUPLING ONE OR MORE AIRFLOW
ACCELERATORS TO OPTOELECTRONIC DEVICES
HAVING ONE OR MORE HEAT EXCHANGERS TO
INCREASE A SPEED OF AN AIRFLOW INTO THE HEAT
EXCHANGERS
1502
```

```
COUPLING A ROTATIONAL MEMBER (E.G.,
A TORQUE TUBE) ADAPTED TO ROTATE AT
LEAST THE OPTOELECTRONIC DEVICES
1503
```

```
COUPLING ONE OR MORE STRUTS TO THE
OPTOELECTRONIC DEVICES
1504
```

```
GUIDING AIRFLOW BY THE AIRFLOW
ACCELERATORS TOWARDS THE HEAT
EXCHANGERS
1505
```

```
REDUCING ONE OR MORE WIND LOADS BY
THE ONE OR MORE AIRFLOW ACCELERATORS
1504
```

FIG. 15

PASSIVE FLOW ACCELERATOR

FIELD

At least some embodiments of the present invention relate to optoelectronic systems, and more particularly to air flow optimization throughout the systems.

BACKGROUND

Optoelectronic systems typically refer to the systems including optoelectronic devices, for example, photovoltaic ("PV") devices, light emitting diodes ("LEDs"), lasers, photodetectors, and the like. The photovoltaic devices may be the devices that convert solar radiation into electrical energy. Such photovoltaic devices are commonly known as solar cells. Generally, an array of solar cells, each solar cell interconnected, is mounted on a common or shared platform to provide a photovoltaic module. The photovoltaic modules may be electrically coupled to an electrical power distribution network, forming a photovoltaic system.

Generally, a concentrating photovoltaic ("CPV") technology uses optical components to concentrate solar radiation onto the photovoltaic devices. The commercialization of the CPV technology depends on the ability to maintain reliable operating temperatures of all devices within the system throughout a wide range of ambient temperatures and wind speeds. The CPV system typically requires the attachment of heat sinks (e.g., extruded metal or folded sheet metal forms as is common in the industry) to the backside of the solar cell packaging in order to transfer the heat from the cell to the ambient air. The use of the optics components often deflects wind from flowing through the heat sinks in some orientations required for sun tracking. The large gradient in the airflow speeds through the array of heat sinks results in a large difference in cell temperatures. For most systems there is a tendency for cells in a specific position on the array to run hotter or colder than the rest of the array.

Generally, the large range in operating temperature of the optoelectronic devices creates inefficiency in the optoelectronic system unless different cooling devices are used at different locations adding cost and complexity to the system assembly and component fabrication.

An alternative way to build the PV system may be to design all heat sinks of the PV system for the hot regions on the array which causes the heat sinks for the cooler regions to be overdesigned. Because heat sink cost is a relatively large portion of the system this results in lost profit margin on the final product.

From an electrical efficiency perspective, the thermal gradient in the string of the PV devices induces a corresponding mismatch in optimum operating points between the cells that results in efficiency losses. From a reliability perspective, the hotter devices are more likely to fail compared to devices that typically operate at a reduced temperature. Thus, any warranties of the system can be plagued by early failure of a portion of the system.

BRIEF DESCRIPTION OF DRAWINGS

The following description includes discussion of figures having illustrations given by way of example of implementations of embodiments of the invention. The drawings should be understood by way of example, not by way of limitation. As used herein, references to one or more "embodiments" are to be understood as describing a particular feature, structure, or characteristic included in at least one implementation of the invention. Thus, phrases such as "in one embodiment" or "in an alternate embodiment" appearing herein describe various embodiments and implementations of the invention, and do not necessarily all refer to the same embodiment. However, they are also not necessarily mutually exclusive.

FIG. 15 is a flowchart of an exemplary embodiment of a method to provide a system to accelerate airflow into a heat exchanger.

DETAILED DESCRIPTION

Methods and apparatuses to increase a speed of airflow through a heat exchanger are described. The embodiments of the invention will be described with references to numerous details set forth below, and the accompanying drawings will illustrate the embodiments of the invention. The following description and drawings are illustrative of the embodiments of the invention and are not to be construed as limiting the invention. Numerous specific details are described to provide a thorough understanding of the present invention. However, in certain instances, well known or conventional details are not described in order to not unnecessarily obscure the present invention in detail.

Reference throughout the specification to "at least some embodiments", "another embodiment", or "an embodiment" means that a particular feature, structure, or characteristic described in connection with the embodiment is included in at least at least some embodiments of the present invention. Thus, the appearance of the phrases "in at least some embodiments" or "in an embodiment" in various places throughout the specification are not necessarily all referring to the same embodiment. Furthermore, the particular features, structures, or characteristics may be combined in any suitable manner in one or more embodiments.

More specifically, methods and apparatuses providing a passive airflow accelerator to an optoelectronic device are described. In at least some embodiments, the optoelectronic device has a heat exchanger. The optoelectronic device is coupled to an airflow accelerator. The airflow accelerator has a surface to guide the airflow towards the heat exchanger. In at least some embodiments, an optical element is coupled to the optoelectronic device that is coupled to the airflow accelerator. The system including one or more rows of optoelectronic devices having heat exchangers and one or more rows of airflow accelerators coupled to the optoelectronic devices to increase the speed of airflow through the respective heat exchangers is also described herein.

In at least some embodiments, methods and apparatuses described herein relate to thermal management of concentrating photovoltaic arrays and to provide uniform temperatures across the array. A uniform temperature reduces mismatch losses and allows the lowest cost heat sink to be designed for the system. In at least some embodiments, the methods and apparatuses described herein allow for the matching of heat sink performance across the array of receivers over a wide range of wind conditions and system elevations providing a single cost and performance specification for the system.

Figure 1:
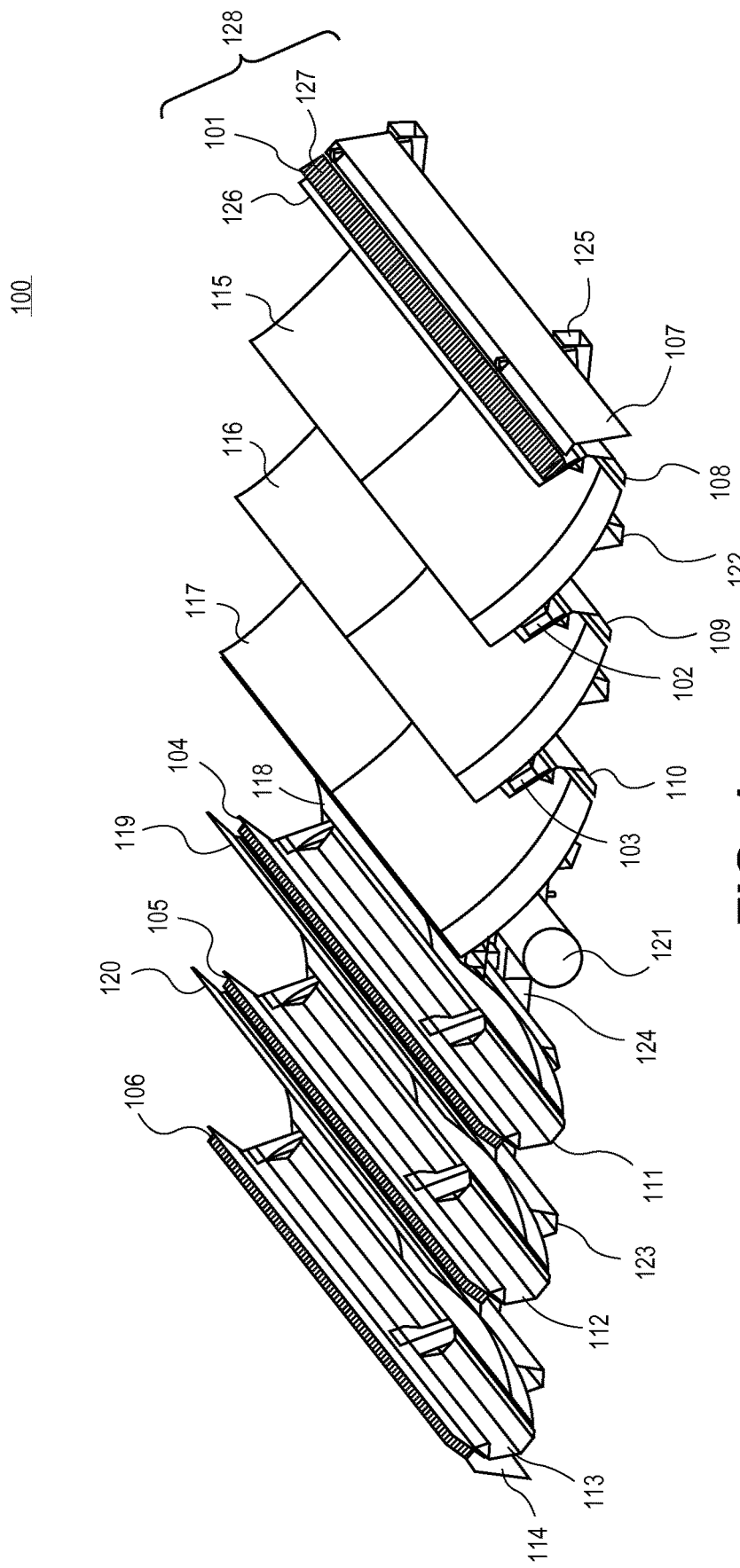
FIG. 1 shows a three dimensional top view of an exemplary embodiment of a section of a system to accelerate airflow into heat exchangers.

FIG. 1 shows a three dimensional top view 100 of an exemplary embodiment of a section of a system to accelerate airflow into heat exchangers. The system has one or more rows of optoelectronic devices having heat exchangers, such as optoelectronic devices 101, 102, 103, 104, 105, and 106, shown in FIG. 1.

In at least some embodiments, each of the optoelectronic devices having heat exchangers 101, 102, 103, 104, 105, and 106 is a photovoltaic ("PV") device. The PV device ("receiver") can include one or more solar cells, e.g., the solar cells including silicon. In at least some embodiments, each of the optoelectronic devices having heat exchangers 101, 102, 103, 104, 105, and 106 is a light emitting diode, a laser, and any other optoelectronic device. The heat exchanger of the optoelectronic device may be, for example, a heat sink, a fan, and any other passive or active heat dissipating device.

As shown in FIG. 1, an optoelectronic device has a front portion, such as a portion 126 and a back portion, such as a portion 127. In at least some embodiments, the front portion includes a light receiving window (e.g., color glass), one or more solar cells to convert light into electricity, and electrical interconnects coupled to the solar cells. In at least some embodiments, the back portion includes a heat exchanger with fins extending along the back of the one or more solar cells. In at least some other embodiments, the front portion includes a light transmitting window (e.g., glass), and one or more light transmitting devices, e.g., lasers, LEDs, or a combination thereof. In at least some embodiments, the back portion 127 includes a heat exchanger with fins extending along the back of the one or more light transmitting devices.

As shown in FIG. 1, rows of airflow accelerators 107, 108, 109, 110, 111, 112, 113, and 114 are coupled to the rows of optoelectronic devices to increase the speed of airflow through the respective optoelectronic device heat exchangers. In at least some other embodiments, the airflow accelerator and the optoelectronic device are separated from each other by an air gap and are both attached to a fixed structure ("support member") so the position of the airflow accelerator relative to the optoelectronic devices is fixed. In at least some other embodiments, the airflow accelerator is directly attached to the back of optoelectronic device. In at least some other embodiments, the airflow accelerator is coupled to the optoelectronic device by using one or more hinges. In at least some embodiments, the airflow accelerator, which is coupled to the optoelectronic device by one or more hinges, can move when the wind pushes it to have better performance.

The airflow accelerators are configured to increase airflow through the edge optoelectronic devices in an array as well as to maximize the airflow through the entire system, as described in further detail below. The airflow accelerator can be, for example, a plate fixedly coupled to the optoelectronic device to guide the airflow through the heat exchanger (e.g., heat sink) of the device.

Guiding the airflow through the heat sink reduces the device (e.g., cell) temperature for the array of optoelectronic devices and provides a more uniform operating point within the string of optoelectronic devices. It also creates a more uniform reliability condition for the entire array of optoelectronic devices as all optoelectronic device units experience nearly the same temperature cycles and extremes. Additionally, a wind load onto the system can be reduced by coupling the airflow accelerator to the optoelectronic device, as described in further detail below.

In at least some embodiments, the airflow accelerator has a surface (e.g., a plate) extending from the respective optoelectronic device to collect the airflow that otherwise bypasses that optoelectronic device. The airflow accelerator can be referred as a spoiler configured to "spoil" the unfavorable airflow movement around the optoelectronic device. The airflow can be deflected by the surface of the airflow accelerator and guided towards a heat exchanger of the optoelectronic device, as described in further detail below.

As shown in FIG. 1, each of the airflow accelerators, such as airflow accelerators 107-114, has a surface extending from a respective optoelectronic device to guide the airflow towards the respective heat exchanger. In at least some embodiments, the size of the surface of the airflow accelerator, position of the airflow accelerator relative to the heat exchanger, or both can determine increase in speed of the airflow through the heat exchanger. The size and the position of the surface of the edge flow accelerator relative to the heat exchanger can be adjusted to interrupt the airflow that otherwise bypasses the heat exchanger and force that airflow to go through that heat exchanger.

Further, the size and the position of the surface of the airflow accelerator relative to the heat exchanger can be adjusted to increase the speed of the existing airflow through the heat sink or prevent bypass airflow at specific orientations of the system. For example, the airflow acceleration (e.g., increase in the speed of the airflow and/or amount of the airflow) and torque load reduction can be boosted by increasing the size of the surface of the airflow accelerator, as set forth in further detail below.

In at least some embodiments, the position of the surface of the flow accelerator relative to the optoelectronic device is fixed, as described in further detail below. In at least some embodiments, the airflow accelerator includes a first surface, and a second surface coupled to the first surface, wherein the first surface is configured to guide the airflow towards the heat exchanger, and the second surface is adapted to redirect the airflow, which otherwise bypasses the optoelectronic device, towards the first surface, as described in further detail below.

The two surfaces of the airflow accelerator can be positioned relative to each other at an angle, as described in further detail below. The airflow accelerator can be made of any rigid material that the wind cannot pass through. In at least some embodiments, the airflow accelerator includes a metal, a plastic, a glass, or any combination thereof. In at least some embodiments, the flow accelerator includes a bent sheet of metal. The airflow accelerator can be made of aluminum, steel, or any other rigid sheet metal.

As shown in FIG. 1, the system includes one or more rows of optical elements 115, 116, 117, 118, 119, and 120 coupled to respective optoelectronic devices. The optical element may be, for example, a mirror, a lens, or any other optical element. In at least some embodiments, the optical element is adapted to concentrate (e.g., to collect, reflect, or refract) light onto the optoelectronic device.

In at least some embodiments, rows of optical elements 115, 116, 117, 118, 119, and 120 are adapted to concentrate light onto the rows of optoelectronic devices 101-106 respectively, as described in further detail below. In at least some embodiments, the optical element is adapted to collect, reflect, or refract light emitted from the respective optoelectronic device. In at least some embodiments, the rows of optical elements are adapted to collect, reflect, or refract light emitted from the respective optoelectronic devices.

In at least some embodiments, the airflow accelerator is an airflow accelerator coupled to an optoelectronic device positioned at an edge row of the system. As shown in FIG. 1, airflow accelerators 107 and 114 are edge row flow accelerators that are coupled to optoelectronic devices 101 and 106 respectively positioned at the edges of the system.

The edge row flow accelerators are configured to duct system level boundary layer airflow through the respective edge row optoelectronic device heat exchangers, as described in further detail below. In at least some embodiments, edge row flow accelerators 108 and 113 can be optionally coupled to optoelectronic devices 101 and 106 respectively. As shown in FIG. 1, the surfaces of the flow accelerators 107 and 108 extend from optoelectronic device 101 at different angles, and the surfaces of the flow accelerators 113 and 114 extend from optoelectronic device 106 at different angles. As shown in FIG. 1, edge row flow accelerator 108 extends towards optical element 115. In at least some embodiments, only one edge flow accelerator 107 is coupled to device 101 and only one edge flow accelerator 114 is coupled to device 106.

Edge row flow accelerator 107 is positioned at an edge row 128 of the system. In at least some embodiments, the size and position of the surface of the edge row flow accelerator relative to the heat exchanger can be adjusted to interrupt the airflow that otherwise bypasses the heat exchanger and force the airflow to go through that heat exchanger so it has the same airflow as the other heat sinks in the center part of the array of rows.

In at least some embodiments, the airflow accelerator is an airflow accelerator coupled to an optoelectronic device positioned at an interior row of the system. As shown in FIG. 1, airflow accelerators 109-112 are interior row flow accelerators that are coupled to optoelectronic devices 102-105 respectively that are positioned at interior rows of the system. The interior row flow accelerators are configured to optimize the airflow throughout the system, as described in further detail below.

The system has a rotational member 121 coupled to rotate the rows of the optoelectronic devices 101-106, the airflow accelerators 107-114, and the optical elements 115-120 into alignment with the sun. As shown in FIG. 1, the portion of the system having rows of optoelectronic devices 101-103, optical elements 115-117, and airflow accelerators 107-110 positioned at one side of rotational member 121 is symmetrical to the portion of the system having rows of optoelectronic devices 104-106, optical elements 118-120, and airflow accelerators 111-114 positioned at an opposite side of rotational member 121.

In at least some embodiments, rotational member 121 rotates the system as a whole into alignment with the sun. In at least some embodiments, the rotational member provides a rotational point to the system. In at least some embodiments, the rotational member has an elongated shape extending in a direction along at least one of the rows of optoelectronic devices, optical elements, and airflow accelerators providing a rotational axis for the system. The rotational member can be, for example, a torque tube. The torque tube can have a rectangular, square, round, or oval cross-section. In at least some embodiments, the rotational member is a torque tube having a round cross-section.

As shown in FIG. 1, fixtures, such as a fixture 122, and a fixture 123, are attached to the respective optical elements, such as optical elements 115 and 119. Each of the fixtures extends along the rows of optical elements. The fixture, e.g., fixture 122 is attached to the back sides of the optical elements along the row, e.g., along the row of optical elements 115. Each of the fixtures propagating along the row, such as a fixture 122, reinforces the optical element, (e.g., a mirror) and makes the optical element stiffer. In at least some embodiments, the fixture to reinforce the optical element includes a metal, e.g., steel.

In at least some embodiments, the system has struts to support the rows of optoelectronic devices, optical elements, and the airflow accelerators. As shown in FIG. 1, the struts, such as a strut 124 are coupled to the rotational member 121 to mount the rows of optoelectronic devices, optical elements, and the airflow accelerators. In at least some embodiments, the rows of optoelectronic devices, optical elements, and the airflow accelerators are mounted onto the struts by fasteners, e.g., bolts, pins, or rivets. In at least some embodiments, the struts maintain the optoelectronic devices, optical elements, and the airflow accelerators in line with each other. As shown in FIG. 1, edge row flow accelerator 107 is coupled to the optoelectronic device 101 mounted at an edge 125 of the strut 124 of the system. In at least some embodiments, accelerator 107 is coupled to optoelectronic device 101 by a vertical support member (not shown) positioned between the edge 125 and device 101. In at least some embodiments, accelerator 107 is directly attached to optoelectronic device 101.

Figure 16:
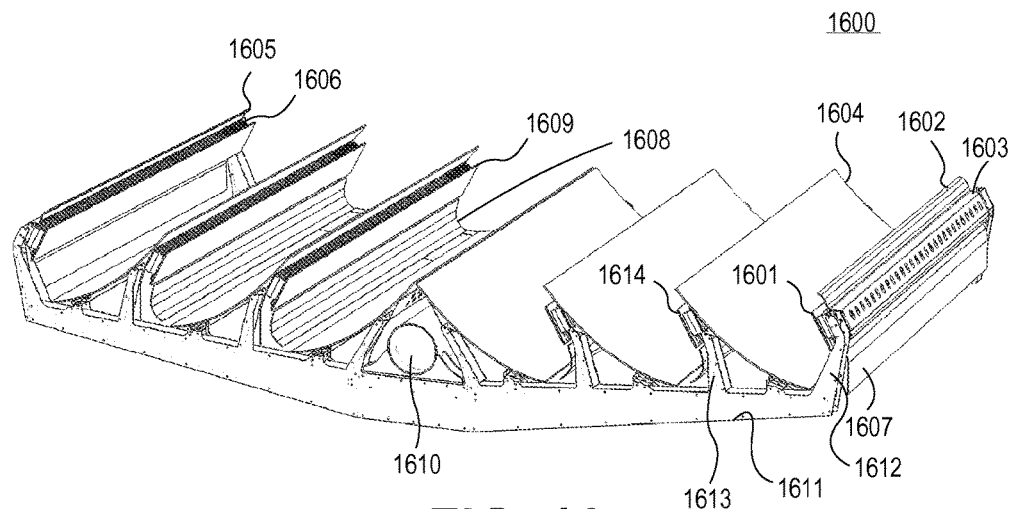
FIG. 16 shows a three dimensional top view of another exemplary embodiment of a section of a system to accelerate airflow into heat exchangers.

FIG. 16 shows a three dimensional top view 1600 of another exemplary embodiment of a section of a system to accelerate airflow into heat exchangers. The system has one or more rows of optoelectronic devices, such as optoelectronic devices 1601 and 1606. The optoelectronic devices have heat exchangers with fins extending along the back of the optoelectronic device, as described above. The optoelectronic device may be, for example, a PV device including one or more solar cells, a light emitting diode, laser, and any other optoelectronic device. The heat exchanger may be, for example, a heat sink, a fan, and any other passive or active heat dissipating device, as described above. The system includes rows of optical elements, such as an optical element 1604. The system one or more horizontal structural support members, such as a horizontal structural support member 1603. In at least some embodiments, the horizontal structural support member ("hat section") holds onto the heat sink of the edge row optoelectronic device and is attached to a support structure. Typically, the hat section refers to a mechanical component that is bent as a "hat" and bonded to another component for added stiffness. As shown in FIG. 16, horizontal structural support member 1603 holds onto the heat sink of the optoelectronic device 1601 and is attached to a support structure 1611 (e.g., a strut).

The system has lower edge row flow accelerators coupled to the optoelectronic devices positioned at edge rows of the system, such as a lower edge row flow accelerator 1607 and lower interior row flow accelerators coupled to the optoelectronic devices positioned at interior rows of the system, such as a lower interior row flow accelerator 1608, as described above. As shown in FIG. 16, lower edge row flow accelerator 1607 has a surface extending at an angle down underneath a lower portion of an optoelectronic device 1601. Lower interior row flow accelerator 1608 has a surface extending at an angle down underneath a lower portion of optoelectronic device 1609.

Each of the lower edge row flow accelerator and lower interior row flow accelerator can be configured to increase speed of the airflow in one or more orientations through a heat exchanger of the optoelectronic device the flow accelerator is coupled to, as described above. For example, the surface of the lower edge row flow accelerator can deflect the airflow that passes underneath the optoelectronic device upwards and through the heat exchanger.

As shown in FIG. 16, an upper edge row flow accelerator 1602 is coupled to an upper portion of edge row optoelectronic device 1601 and an upper edge row flow accelerator 1605 is coupled to an edge row optoelectronic device 1606. Upper edge row flow accelerator 1602 has a surface that extends at a predetermined angle above optoelectronic device 1601, and upper edge row flow accelerator 1605 has a surface that extends at a predetermined angle above optoelectronic device 1606. As shown in FIG. 16, the surface of the upper edge row flow accelerator 1602 can be bent towards the front portion of the optoelectronic device 1601. The upper edge row flow accelerator can be configured to deflect the airflow in one or more directions that the lower edge row airflow accelerator cannot assist with. For example, the surface of the upper edge row airflow accelerator can deflect the airflow that passes over the optoelectronic device downwards and through the heat exchanger. In at least some embodiments, the size of the surface of the upper edge row flow accelerator, position of the airflow accelerator relative to the heat exchanger, or both can be adjusted to increase the speed of the airflow, an amount of the airflow through the heat exchanger, or both.

Additionally, the upper edge row flow accelerator can be configured to provide protection to the optoelectronic device including a backsheet and heat sink against direct sun exposure. As shown in FIG. 16, the back side of the edge row optoelectronic device 1601, unlike an interior row optoelectronic device 1614, is not protected by optical element 1604. As such, the back side of the edge row optoelectronic device 1601 without accelerator 1602 can be exposed to direct sunlight.

In at least some embodiments, the position of each of the airflow accelerators relative to the optoelectronic device is fixed. In at least some other embodiments, the airflow accelerator and the optoelectronic device are separated from each other by an air gap and are both attached to a support member. In at least some other embodiments, the airflow accelerator is directly attached to the back of the optoelectronic device.

The system has a rotational member 1610 coupled to rotate the rows of the optoelectronic devices, the airflow accelerators, and the optical elements into alignment with the sun, as described above. As shown in FIG. 16, rotational member 1610 is mounted onto a support structure 1611 having vertical support members, such as vertical support members 1612 and 1613. The rows of optoelectronic devices, airflow accelerators, and the optical elements are mounted over a support structure 1611, as shown in FIG. 16. Support structure 1611 is described in further detail below with respect to FIGS. 17-19.

Figure 2:
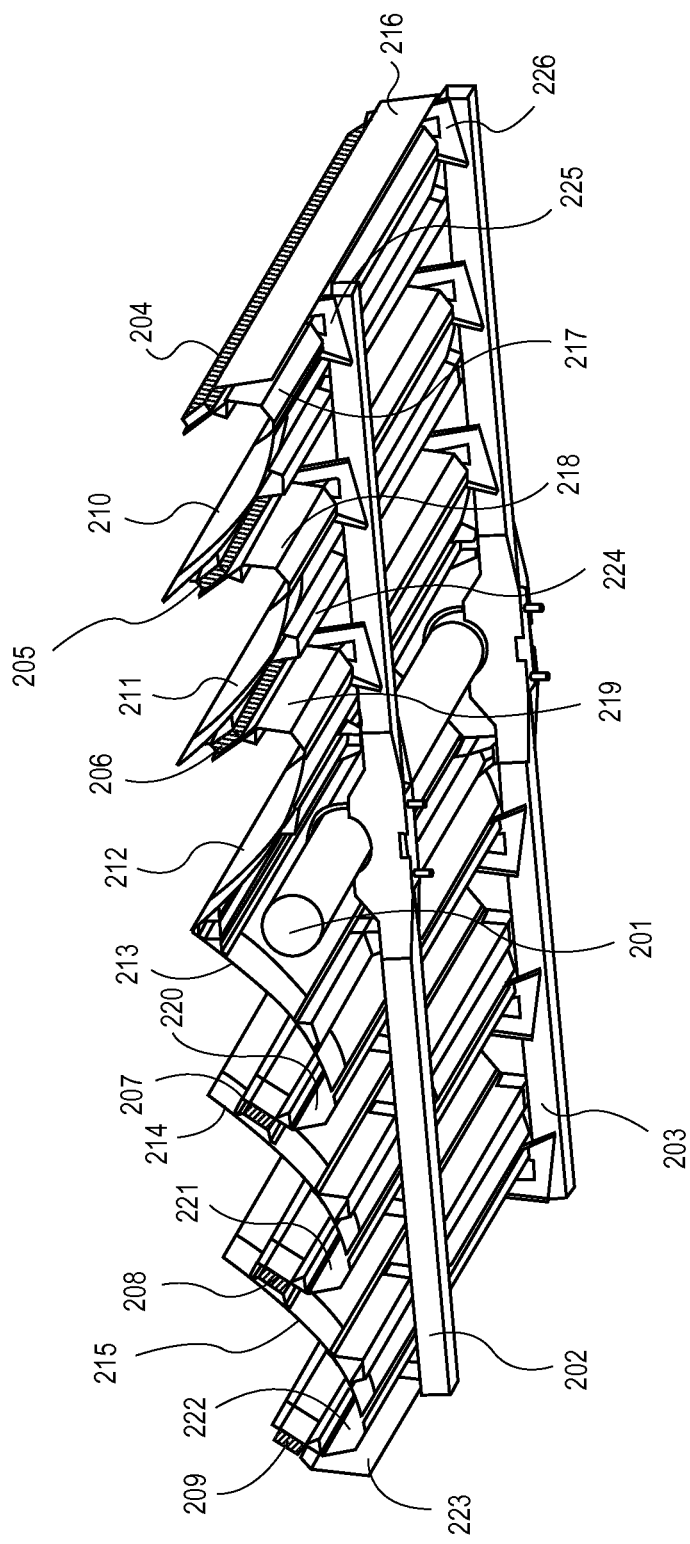
FIG. 2 shows a three dimensional bottom view of an exemplary embodiment of a section of a system to accelerate airflow into heat exchangers.

FIG. 2 shows a three dimensional bottom view 200 of an exemplary embodiment of a section of a system to accelerate airflow into heat exchangers. As shown in FIG. 2, a rotational member 201 is attached to struts, such as a strut 202 and a strut 203. The rows of optoelectronic devices with heat exchangers 204-209, the rows of optical elements 210-215, and the airflow accelerators 216-223 are mounted over the struts 202 and 203. In at least some embodiments, the rows of airflow accelerators are mounted over the struts by vertical supports, such as a vertical support 225. As shown in FIG. 2, airflow accelerator 216 is attached to vertical support 225, which is attached to strut 202. In at least some embodiments, the optical elements are mounted onto the struts using elongated fixtures, such as an elongated fixture 224. As shown in FIG. 2, a bottom side of the elongated fixture 224 is attached to the struts 202 and 203. The elongated fixture can be attached to the strut by using a fastener, e.g., a pin, bolt, rivet, and the like. As shown in FIG. 2, a top side of the elongated fixture 224 is attached to the backs of optical elements 210. The elongated fixture can be attached to the back of the optical element by a fastener, e.g., a pin, bolt, rivet, and the like.

As shown in FIG. 2, the heat exchangers of the optoelectronic devices 205-208 are adjacent to the backs of optical elements 210-215 respectively. In at least some embodiments, the back of the optoelectronic device having heat exchanger is directly attached to the back of the respective optical element. In at least some other embodiments, the backs of the optoelectronic device and the optical element are separated from each other by an air gap, and are rigidly attached to the same support member, so that the optoelectronic device and optical element don't move relative to each other.

As shown in FIG. 2, edge row optoelectronic devices 204 and 209 are mounted over the opposite edges of the struts 202 and 203. In at least some embodiments, the edge row optoelectronic devices are attached to vertical support members attached to the struts, such as vertical support members 225 and 226. As shown in FIG. 2, a lower portion of the vertical support 225 is attached to strut 202. The lower portion of the vertical support can be attached to the strut by a fastener, e.g., a pin, bolt, rivet, and the like. An upper portion of the vertical support 225 is attached to an edge row optoelectronic device 204, as shown in FIG. 2. The vertical support can be attached to the frame of the optoelectronic devices by a fastener, e.g., a pin, bolt, rivet, and the like. The edge row optoelectronic devices 204 and 209 are not mounted onto the back of the optical elements, as shown in FIG. 2.

As shown in FIG. 2, interior row flow accelerators 218-221 are coupled to the interior row optoelectronic devices 204-209 respectively. Edge row flow accelerators 216 and 223 are coupled to the edge row optoelectronic devices 204 and 209 respectively, as shown in FIG. 2. In at least some other embodiments, the airflow accelerator and the optoelectronic device are separated from each other by an air gap and both are attached to one or more vertical support members. In at least some embodiments, the airflow accelerator is attached at certain locations to one or more vertical support members by fasteners, e.g., bolts, pins, or rivets. Each of the vertical support members can be made of a metal, e.g., steel.

As shown in FIG. 2, the vertical support members, e.g., vertical support member 225, can have a triangular shape. In at least some embodiments, the airflow accelerator is mounted to a vertical support, such as vertical support 225 that holds the optoelectronic device. As shown in FIG. 2, edge row flow accelerator 216 is rigidly attached to the vertical supports 225 and 226 that hold the edge optoelectronic device 204.

As shown in FIG. 2, the position of the edge row flow accelerator 216 relative to the optoelectronic device can be fixed by the vertical supports, so the airflow accelerator and the optoelectronic device don't move relative to each other. In at least some other embodiments, the airflow accelerator is directly attached to the optoelectronic device. In at least some other embodiments, the airflow accelerators (not shown) are mounted to supports (e.g., such as fixture 224) that hold the respective optical elements.

In at least some embodiments, the system depicted in FIG. 2 is a PV system, wherein each of the optoelectronic devices having heat exchangers is a PV device. The PV device ("receiver") can include one or more solar cells. In at least some other embodiments, the optoelectronic devices having heat exchangers are light emitting diodes, lasers, or any other optoelectronic devices. In at least some embodiments, the heat exchanger of the optoelectronic device is a heat sink.

In at least some other embodiments, the heat exchanger of the optoelectronic device includes a fan, a heat sink, any other passive or active heat dissipating device, or a combination thereof. The optical element coupled to the optoelectronic device may be, for example, a mirror, a lens, or any other optical element.

Figure 17:
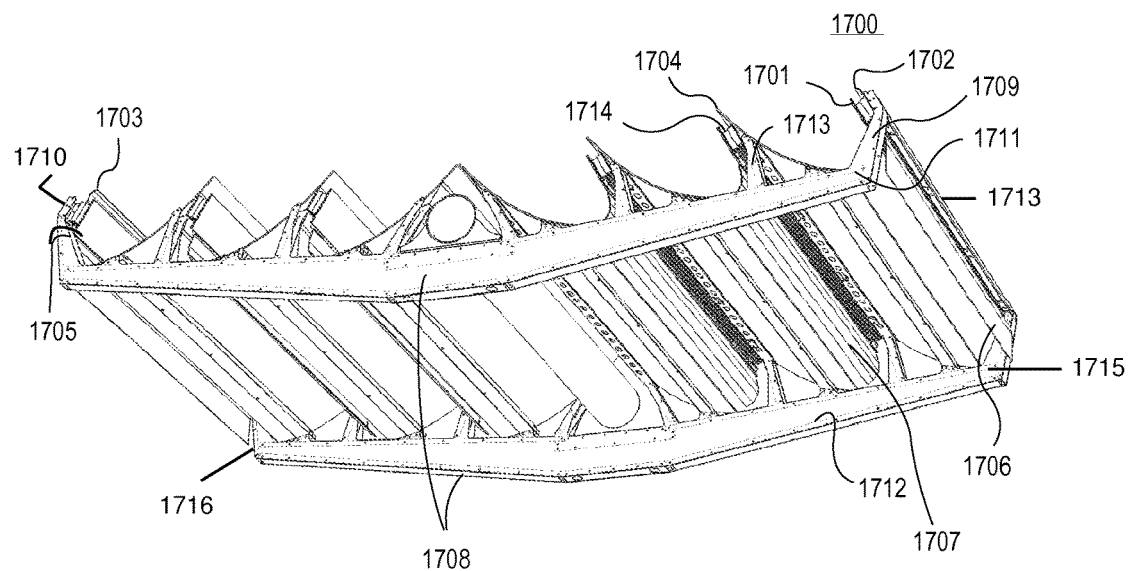
FIG. 17 shows a three dimensional bottom view of another exemplary embodiment of a section of a system to accelerate airflow into heat exchangers.

FIG. 17 shows a three dimensional bottom view 1700 of another exemplary embodiment of a section of a system to accelerate airflow into heat exchangers. The system has one or more rows of optoelectronic devices, such as optoelectronic devices 1701 and 1705. The optoelectronic devices have heat exchangers with fins extending along the back of the optoelectronic device, as described above. The system has rows of optical elements, such as an optical element 1704. The system has lower edge row flow accelerators and upper edge row flow accelerators coupled to the optoelectronic devices positioned at the edge rows of the system, such as a lower edge row flow accelerator 1706, an upper edge row flow accelerator 1702, and an upper edge row flow accelerator 1703; and interior row flow accelerators coupled to the optoelectronic devices positioned at interior rows of the system, such as an interior row flow accelerator 1707.

As shown in FIG. 17, the rows of optoelectronic devices, airflow accelerators, and the optical elements are mounted over a support structure 1708. Support structure 1708 has struts 1711 and 1712. As shown in FIG. 17, struts 1711 and 1712 have vertical support members that are attached to the backs of the respective edge row optoelectronic devices. Strut 1711 has a vertical support member 1709 that is attached to one end of a structural support member 1713 ("hat section") holding optoelectronic device 1701 and a vertical support member 1710 that is attached to one end of the hat section attached to the back of the heat exchanger of optoelectronic device 1705. Strut 1712 has a vertical support member 1715 that is attached to another end of the hat section attached to the back of the heat exchanger of optoelectronic device 1701 and a vertical support member 1716 that is attached to another end of the hat section attached to the back of the heat exchanger of optoelectronic device 1705. Vertical support member can be attached to the hat section by a fastener, for example, a pin, bolt, rivet, and the like.

As shown in FIG. 17, strut 1711 has a vertical support member 1713 that is coupled to the back of the optical element 1704. In at least some embodiments, coupling the vertical support member to the back of the optical element involves attaching the vertical support member to a stiffening feature on the back side of the optical element, as described in further detail below. As shown in FIG. 17, an interior row optoelectronic device 1714 having a heat exchanger is attached to the back side of the optical element 1704.

In at least some embodiments, the airflow accelerators are attached to respective vertical support members. For example, upper edge flow accelerator 1702 and lower edge flow accelerator 1706 can be attached to vertical support member 1709 at one location and to vertical support member 1715 at another location by fasteners, for example, pins, bolts, rivets, and the like. In at least some embodiments, the position of the airflow accelerator relative to the optoelectronic device is fixed, as described above.

Figure 3:
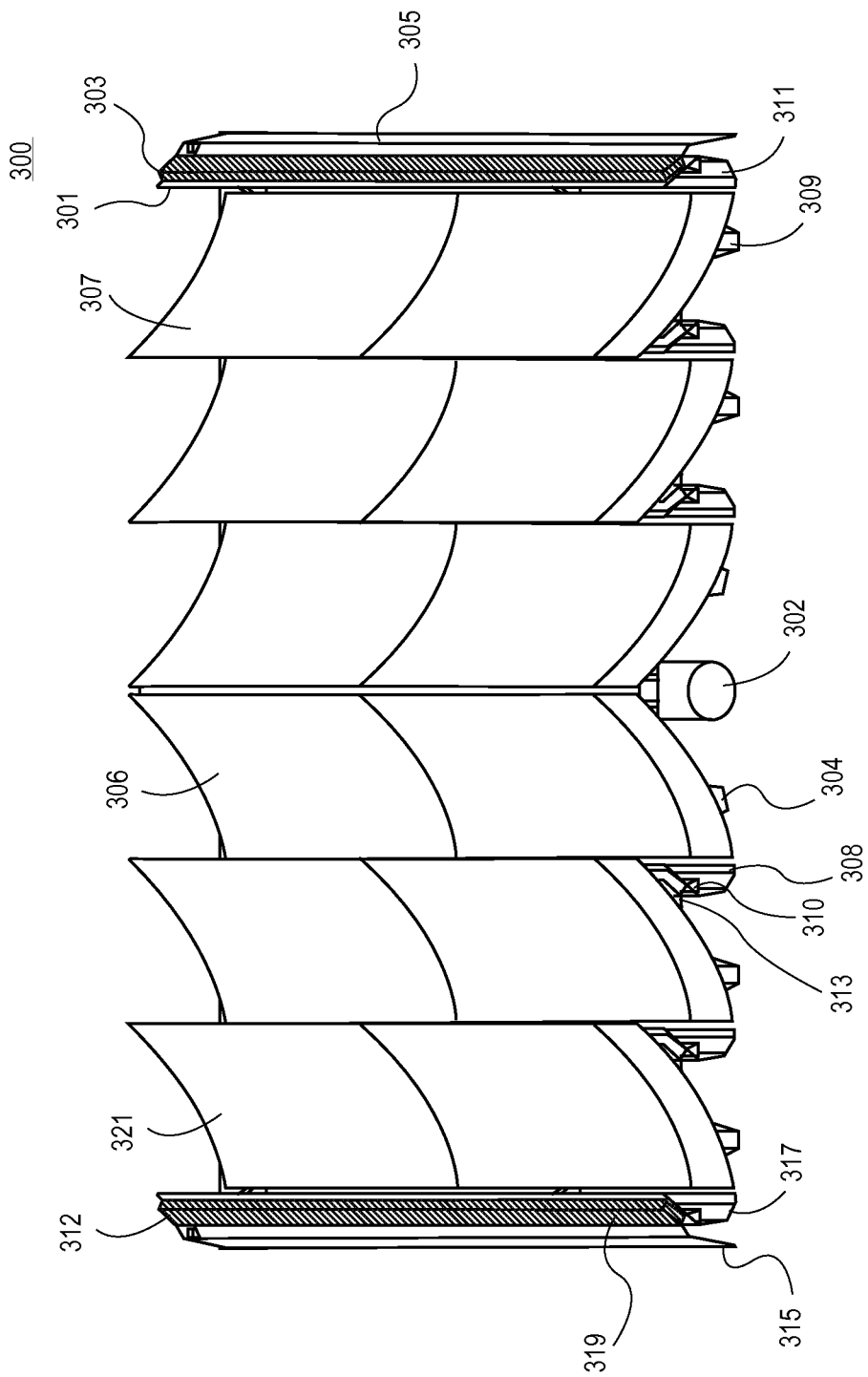
FIG. 3 shows a top view of an exemplary embodiment of a section of a photovoltaic system to accelerate airflow into heat exchangers.

FIG. 3 shows a top view 300 of an exemplary embodiment of a section of a photovoltaic system to accelerate airflow into heat exchangers. The system includes receivers having heat exchangers, such as receivers 301, 310, and 312 having heat exchangers 303, 313, and 319 respectively, as shown in FIG. 3. The airflow accelerators, such as airflow accelerators 305, 311, 308, 317, and 315 are coupled to the respective receivers, to increase the speed of airflow through the respective receiver heat exchangers, such as heat exchangers 303, 313, and 319, as set forth above. The system has optical elements, such as optical elements 307, 306, and 321. The optical elements can include, for example, mirrors, lenses, and any other reflective and/or refractive optics to concentrate light onto the receivers. In at least some embodiments, the optical elements such as optical elements 307, 306, and 321, are curved (e.g., parabolic) mirrors.

The light (e.g., from the sun) can be reflected and/or refracted from each of the optical elements to concentrate onto the respective receiver. For example, light can be reflected from the optical elements 307, 306, and 321 to concentrate onto receivers 301, 310, and 312 respectively. For example, the light collected from the entire area of the parabolic mirror can be concentrated onto the front light receiving portion of the receiver located opposite to the mirror.

As shown in FIG. 3, airflow accelerators 305 and 315 are edge row flow accelerators that are coupled to the receivers 301 and 312 respectively at the opposite edges of the system, as set forth above. In at least some embodiments, edge row flow accelerators 311 and 317 are coupled to the receivers 301 and 312 respectively. The system has interior row flow accelerators, such as an interior row flow accelerator 308 coupled to receiver 310, as set forth above.

The system has a rotational member 302 coupled to rotate the rows of receivers, airflow accelerators, and optical elements into alignment with the sun, as set forth above. As shown in FIG. 3, fixtures, such as a fixture 304, are attached to mount the respective rows of optical elements, such as a row of optical elements 306 over the strut (not shown), as set forth above.

Figure 18:
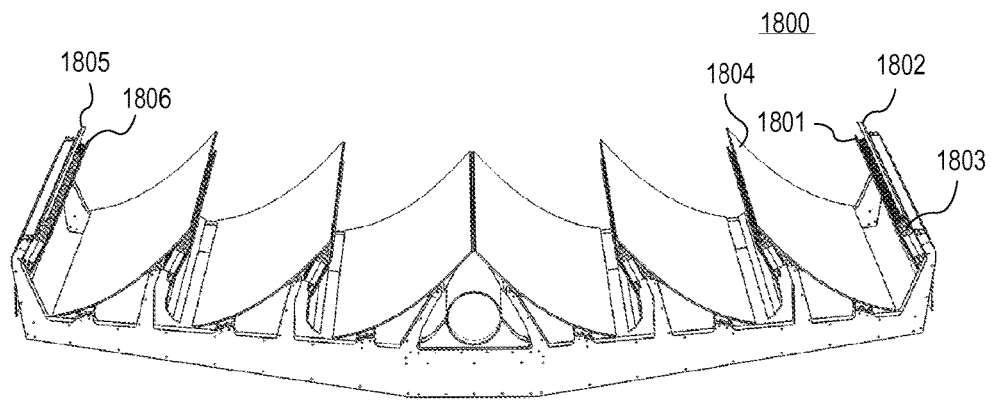
FIG. 18 shows a top view of another exemplary embodiment of a section of a system to accelerate airflow into heat exchangers.

FIG. 18 shows a top view 1800 of another exemplary embodiment of a section of a system to accelerate airflow into heat exchangers. The system includes receivers having heat exchangers, such as receivers 1801 and 1806, as described above. As shown in FIG. 18, receiver 1801 has heat exchanger 1803. The system has optical elements, such as an optical element 1804, as described above. As shown in FIG. 18, an upper edge row airflow accelerator 1802 is coupled to increase the speed of airflow through the heat exchanger of receiver 1801. An upper edge row airflow accelerator 1805 is coupled to increase the speed of airflow through the heat exchanger of receiver 1806.

Figure 4:
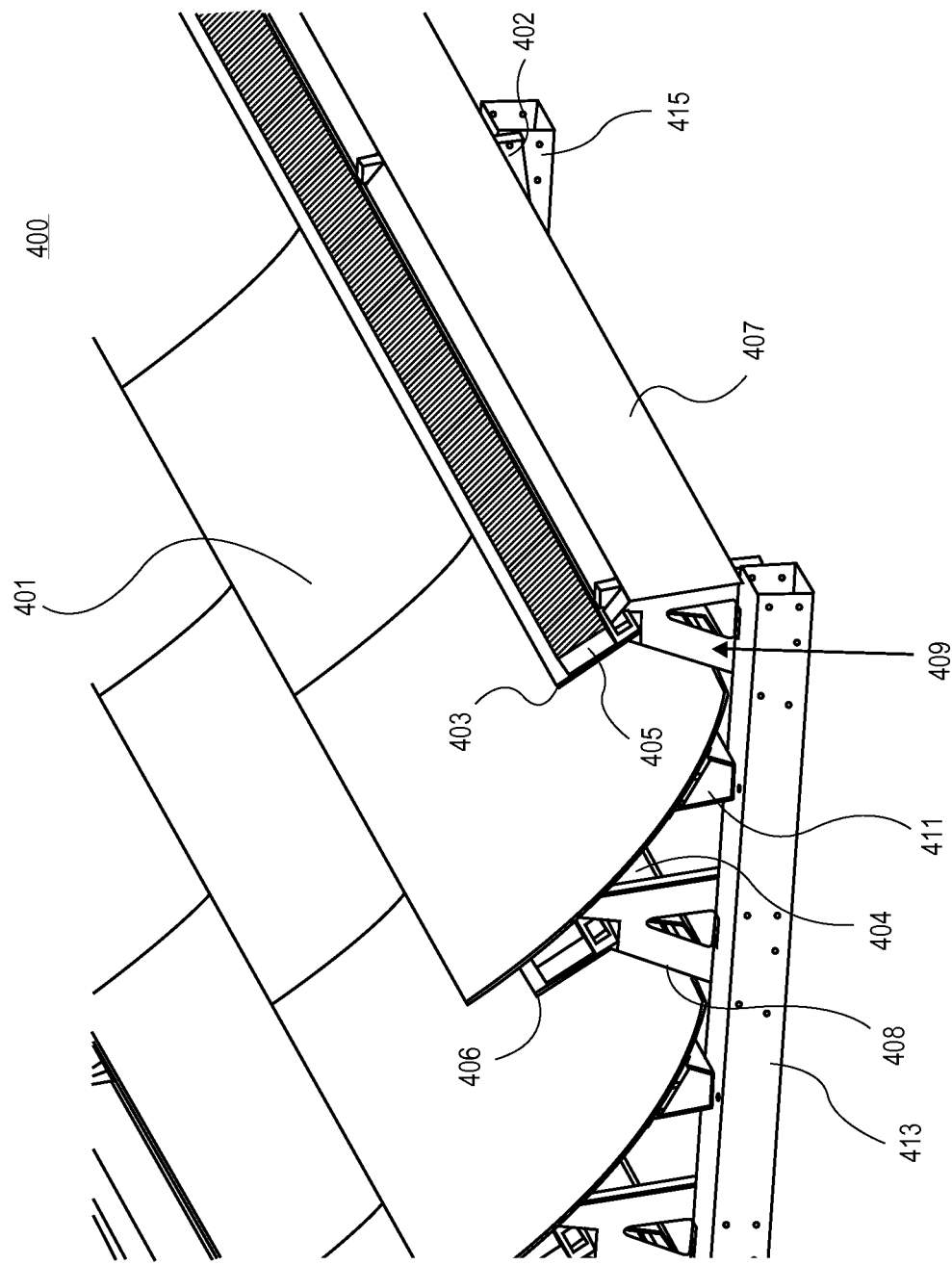
FIG. 4 shows an enlarged three dimensional view of an exemplary embodiment of a section of a PV system.

FIG. 4 shows an enlarged three dimensional view 400 of an exemplary embodiment of a section of a PV system. A receiver 403 having a heat sink 405 is mounted onto an upper portion of a vertical support 409, as shown in FIG. 4. The receiver can be attached to the vertical support by a fastener, such as a pin, bolt, rivet, and the like. A lower portion of vertical support 409 is attached to a strut 413, as shown in FIG. 4. The vertical support can be attached to the strut by a fastener, such as a pin, bolt, rivet, and the like. The vertical support can have a triangular, rectangular, square, trapezoidal, or any other shape.

In at least some embodiments, the position of each of the airflow accelerators relative to the respective receiver is fixed. As shown in FIG. 4, an edge row flow accelerator 407 at one location is fixedly attached to a side portion of the vertical support 409. The edge row flow accelerator 407 can be attached to the vertical support by a fastener, such as a pin, bolt, rivet, and the like. As shown in FIG. 4, edge row flow deflector 407 at another location is fixedly attached to a vertical support 402 attached to a strut 415.

As shown in FIG. 4, a back of an optical element 401 rests upon a fixture 411 attached to strut 413. As set forth above, fixture 411 extends along a row of optical elements 401. The light reflects from optical element 401 to concentrate onto receiver 403. As shown in FIG. 4, a back of a receiver 406 having a heat exchanger is adjacent to a back of optical element 401. In at least some embodiments, receiver 406 is attached to the back of optical element 401. In at least some other embodiments, receiver 406 is attached to vertical support 408, and an interior row flow accelerator 404 at receiver 406 is attached to vertical support 408, as shown in FIG. 4. That is, the position of the interior row flow accelerator relative to the receiver is fixed. As shown in FIG. 4, vertical support 408 is attached to strut 413.

Figure 19:
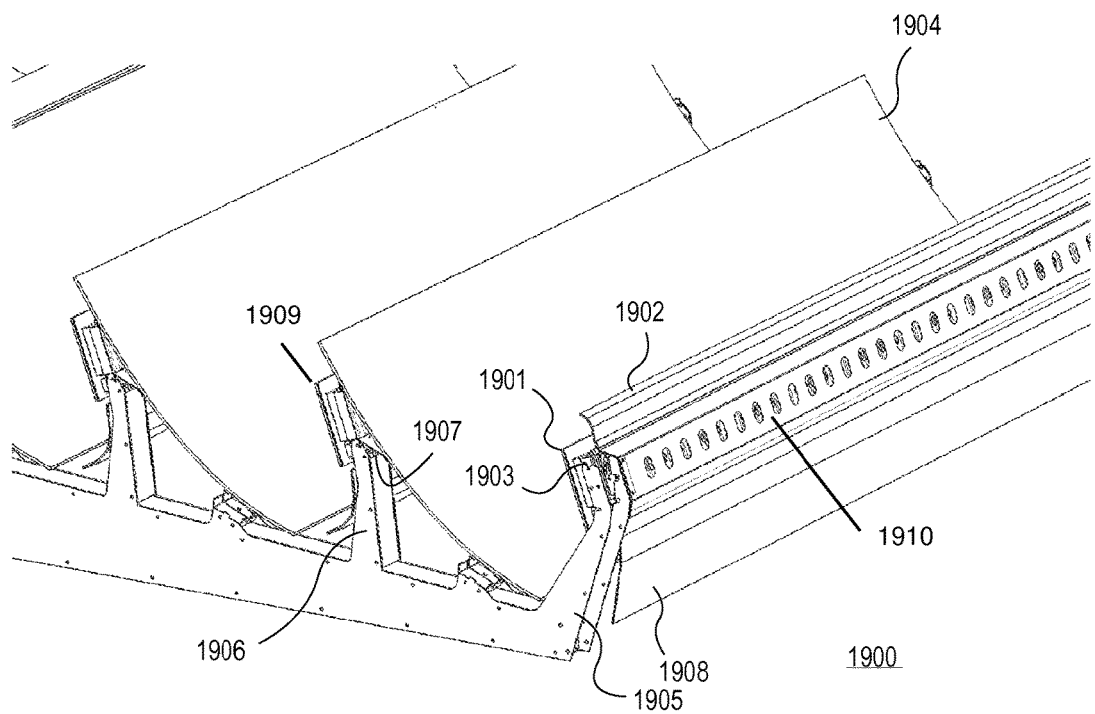
FIG. 19 shows an enlarged three dimensional view of another exemplary embodiment of a section of a PV system.

FIG. 19 shows an enlarged three dimensional view 1900 of another exemplary embodiment of a section of a PV system. As shown in FIG. 19, the PV system has receivers, for example, an edge row receiver 1901 and an interior row receiver 1909, airflow accelerators, for example, an upper edge row flow accelerator 1902 and a lower edge row flow accelerator 1908, and optical elements, for example an optical element 1904, as described above. The upper and lower edge row accelerators 1902 and 1908 are coupled to edge row receiver 1901, as shown in FIG. 19. The receivers, flow accelerators, and optical elements are mounted over a support structure having a strut 1905, as described above. Strut 1905 has vertical support members, such as a vertical support member 1905 and a vertical support member 1906. As shown in FIG. 19, vertical support member 1905 holds edge receiver 1901 that is attached to a structural member 1910 ("hat section") attached to the back of the heat exchanger of receiver 1901. As shown in FIG. 19, vertical support member 1905 is attached to the end of the hat section attached to the back of the heat sink of the receiver 1901. The hat section 1910 can be attached to the vertical support member 1903 by a fastener, such as a pin, bolt, rivet, and the like.

In at least some embodiments, the interior row optoelectronic devices are attached to the back side of the optical elements with the vertical support member only connecting to the stiffening feature on the back side of the respective optical element. As shown in FIG. 19, vertical support member 1906 is connected to a stiffening feature 1907 on the back side of the optical element 1904. Vertical support member 1906 can be attached to stiffening feature 1907 by a fastener, for example, a pin, bolt, rivet, and the like. The receiver 1909 can be attached to the feature 1907 by a fastener, for example, a pin, bolt, rivet, and the like.

In at least some embodiments, the position of each of the airflow accelerators relative to the respective receiver is fixed. Each of the upper edge row airflow accelerator, lower edge row airflow accelerator, and interior row airflow accelerator can be fixedly attached to the respective vertical support member. As shown in FIG. 19, an upper edge row flow accelerator 1902 can be fixedly attached to a side portion of the vertical support member 1905. The edge row flow accelerator can be attached to the vertical support member by a fastener, such as a pin, bolt, rivet, and the like.

Figure 5:
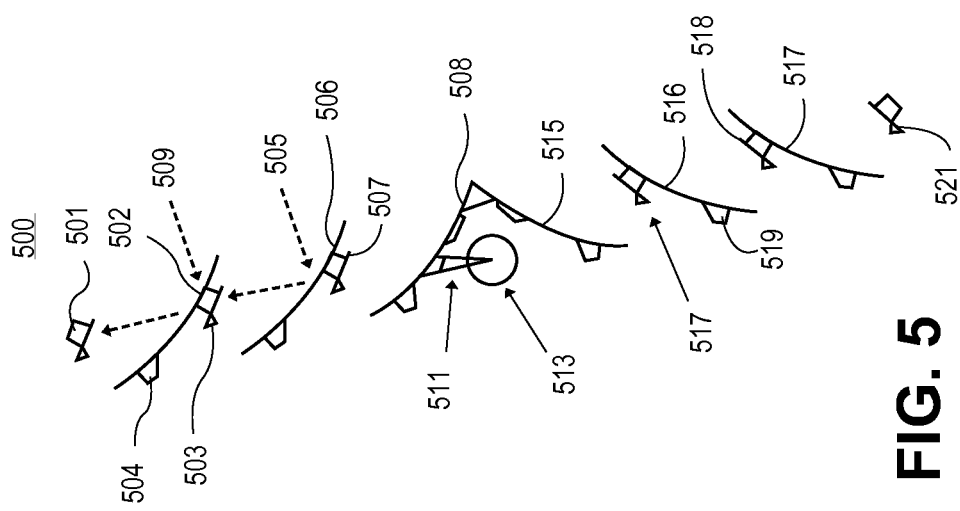
FIG. 5 shows a cross-sectional view of an exemplary embodiment of a photovoltaic ("PV") system without airflow accelerators.

FIG. 5 shows a cross-sectional view 500 of an exemplary embodiment of a photovoltaic ("PV") system without airflow accelerators. As shown in FIG. 5, the PV system has an array of linear concentrator optics 502, 506, 508, 515, 516, and 517, and photovoltaic receivers having heat sinks 501, 503, 507, 517, 518, and 521. The PV receivers 501 and 521 located at the edge rows of the PV system are edge row receivers. The PV receivers 502, 507, 517, and 518 located between the edge row receivers are interior receivers. As shown in FIG. 5, each of the interior receivers 502, 507, 517, and 518 is attached to the back of the respective linear concentrator optics.

As shown in FIG. 5, the edge row receivers 501 and 521 are not attached to the linear concentrator optics. In at least some embodiments, each of the linear concentrator optics 502, 506, 508, 515, 516, and 517 includes a curved (e.g., parabolic) mirror. The curved mirror is configured to concentrate sun light onto the respective receiver. As shown in FIG. 5, light 509 is reflected from the surface of the optics 502 to concentrate onto receiving portion of the receiver 501 (e.g., one or more solar cells). As shown in FIG. 5, receiver 501 is positioned opposite to the respective optics 509. As shown in FIG. 5, the back heat sink portion of receiver 503 is attached to the back surface of the adjacent optics 502.

Light 505 is reflected from a front surface of the optics 506 onto light receiving front portion of the receiver 503 (e.g., one or more solar cells).

As shown in FIG. 5, the PV system has a rotational member 513 configured to rotate the concentrator optics 502, 506, 508, 515, 516, and 517, and receivers 501, 503, 507, 517, 518, and 521 into alignment with the sun, so that the incident angle of the light concentrated by the optics onto the receivers remains fixed. A system elevation angle 511 indicates an angle of the PV system relative to a reference surface, e.g., a ground. The PV system has fixtures, such as fixtures 504 and 519 to support the respective optics, as set forth above.

Figure 6:
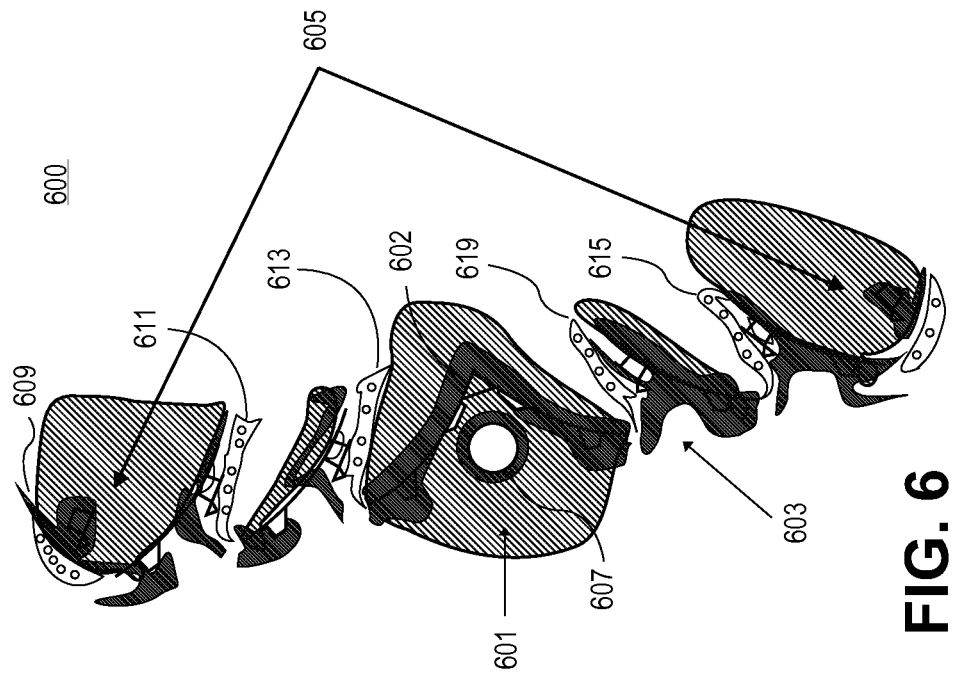
FIG. 6 shows an example of an airflow speed simulation on an exemplary embodiment of a photovoltaic ("PV") system as depicted in FIG. 5.

FIG. 6 shows an example of an airflow speed simulation on an exemplary embodiment of a photovoltaic ("PV") system as depicted in FIG. 5. As shown in FIG. 6, the field wind propagates in a direction of arrow 601 towards the PV system. In FIG. 6, the regions having a substantially low (e.g., about zero) speed of the airflow ("wind shadows") are depicted as having a lined pattern. The about zero speed of the airflow may correspond to the situation where air movement is not capable of removing heat from the heat exchangers.

As shown in FIG. 6, the regions where the heat sinks of the edge row receivers are located, such as regions 605, the regions behind the optics, such as a region 602, and the regions at the rotational member, such as a region 607, are in the wind shadow. In FIG. 6, the regions that have more exposure to the field wind 601 than the wind shadow regions are depicted as having a circle pattern. As shown in FIG. 6, portions of the regions between the optics, such as regions 611, 613, 619, and 615 have the speed of the airflow greater than the speed in the wind shadow regions. Because the airflow curving around the edge of the system has a momentum and cannot rapidly change directions, the edge receiver is left in a wind shadow 605, as shown in FIG. 6.

Because the edge receiver is located in the wind shadow heat cannot be exchanged as efficiently to the air and it typically operates hotter than the other receivers of the system. That is, despite the heat sinks of the receivers being located at the edges of the system where one would intuitively expect more exposure to field winds, the edges of the system (e.g., regions 605) actually reside in a region of low wind due to the natural way the wind moves around the system. Inner row heat sinks see some accelerated flow during a wider range of system orientations, such as the heat sinks at the regions 611, 613, 619, and 615 due to the difference in pressure between the two sides of the system so that the constricted region the air flows through the system from one side (e.g., left to the system) to reach the other side (e.g., right to the system).

Figure 7:
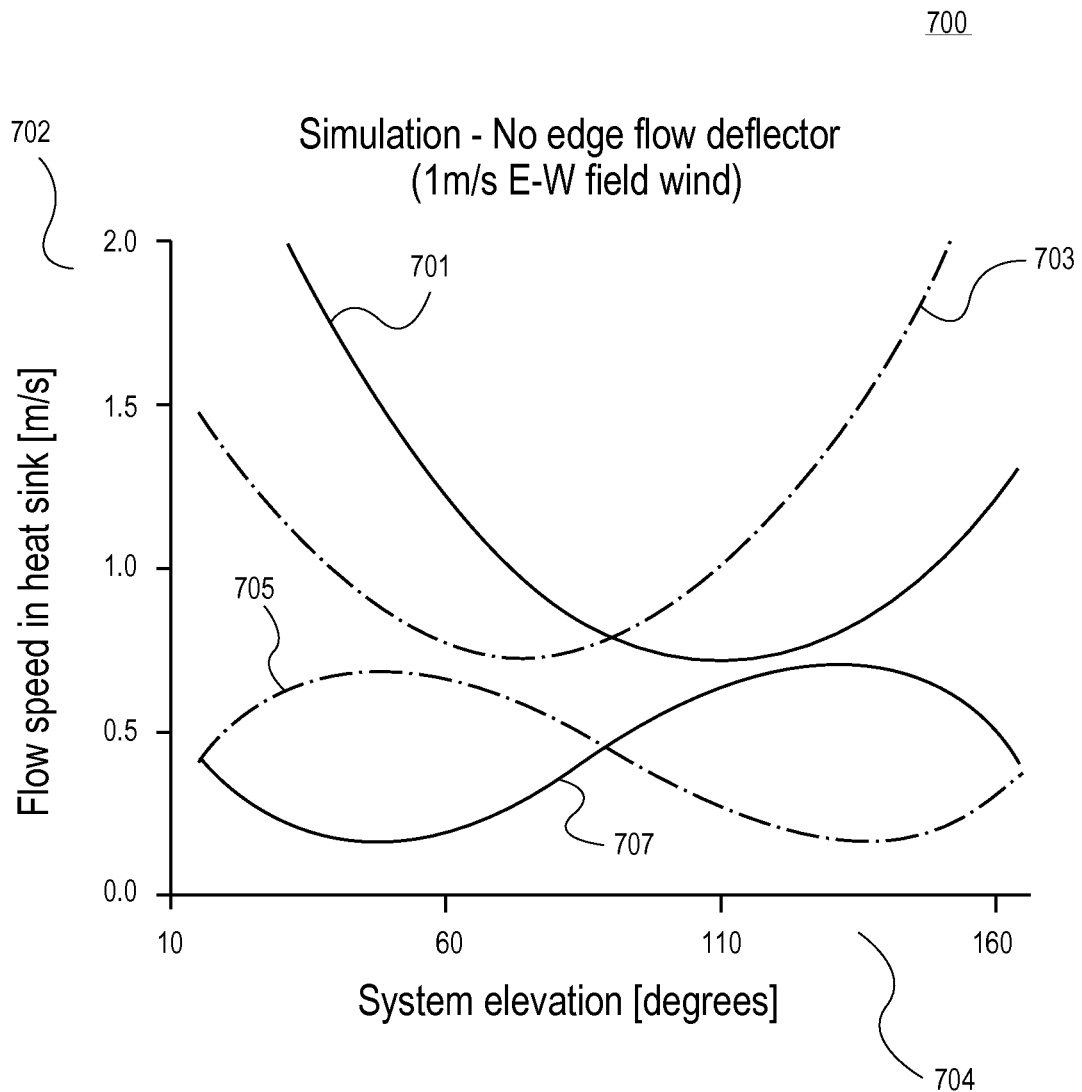
FIG. 7 shows an example of a graph of the simulated wind flow through the heat sinks of the exemplary embodiment of the PV system as depicted in FIG. 5.

FIG. 7 shows an example of a graph of the simulated wind flow through the heat sinks of the exemplary embodiment of the PV system as depicted in FIG. 5. A flow speed in a meter per second ("m/s") in the heat sinks is depicted as a function of an elevation of the system relative to a reference surface, e.g., ground. The simulation of the flow speed is performed at 1 m/s East-West field wind and the average flow speed in the heat exchanger from the East and West field wind simulation is plotted in FIG. 7. As shown in FIG. 7, the average flow speed in the heat sinks of the of edge row receivers 707 and 705 is smaller than the average flow speed in the heat sinks of the interior receivers 701 and 703 at any system elevation.

In addition to flow non-uniformities across the array of cells, there is always an efficiency and reliability benefit when the cells operate at a lower temperature, thus any technology that accelerates the natural wind and convective currents through the heat sink would result in a reduced heat sink performance specification and in turn a lower cost component or a higher reliability for the same priced component.

Figure 8:
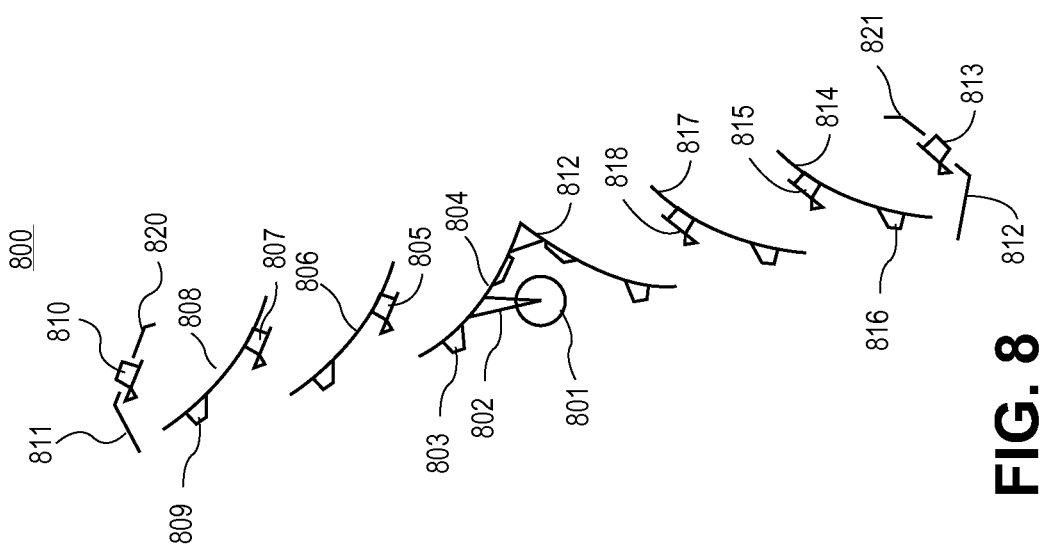
FIG. 8 shows a cross-sectional view of an exemplary embodiment of a photovoltaic ("PV") system having airflow accelerators at the edge rows.

FIG. 8 shows a cross-sectional view 800 of an exemplary embodiment of a photovoltaic ("PV") system having airflow accelerators at the edge rows. The PV system has an array of linear concentrator optics 804, 806, 808, 812, 817, and 814, photovoltaic receivers having heat sinks 810, 807, 805, 818, 815, and 813, and lower edge row airflow accelerators 811 and 812 and upper edge row airflow accelerators 820 and 821 at the PV receivers 810 and 813 respectively located at the edge rows of the PV system, as shown in FIG. 8. The PV receivers 807, 805, 817, and 815 located between the edge row receivers 813 and 811 are interior receivers.

As shown in FIG. 8, each of the interior receivers 807, 805, 817, and 815 is attached to the back of the respective linear concentrator optics. The edge row receivers 811 and 812 are not attached to the linear concentrator optics. In at least some embodiments, each of the linear concentrator optics 804, 806, 808, 812, 817, and 814 includes a curved (e.g., parabolic) mirror. The curved mirror is configured to concentrate sun light onto the respective receiver. Light (not shown) can be reflected from the surface of the optics 808 to concentrate onto light receiving front portion of the receiver 810 (e.g., one or more solar cells). A receiver 810 is positioned opposite to the respective optics 808. Each of the airflow accelerators, for example, airflow accelerator 811, airflow accelerator 812, airflow accelerator 820, and airflow accelerator 821 can increase the airflow acceleration (speed of the airflow, the amount of the airflow into the respective heat sink, or both) and reduce a torque load of the system. For example, the airflow acceleration and torque load reduction can be boosted by increasing the size of the surface of the airflow accelerator extending further from the respective heat sink, adjusting the position of the surface of the airflow accelerator relative to the respective heat sink, or both.

As shown in FIG. 8, the heat sink of receiver 807 is attached to the back surface of the adjacent optics 808. Light (not shown) can be reflected from a front surface of the optics 804 onto light receiving front portion of the receiver 805 (e.g., one or more solar cells). The PV system has a rotational member 801 configured to rotate the concentrator optics 804, 806, 808, 812, 817, and 814, receivers 810, 807, 805, 818, 815, and 813, and airflow accelerators 811 and 812 into alignment with the sun, so that the incident angle of the light concentrated by the optics onto the receivers remains constant. A system elevation angle 802 indicates an angle of the PV system relative to a reference surface (e.g., a ground). The PV system has fixtures, such as fixtures 809, 803, and 816 to support the respective optics, as set forth above.

Figure 9:
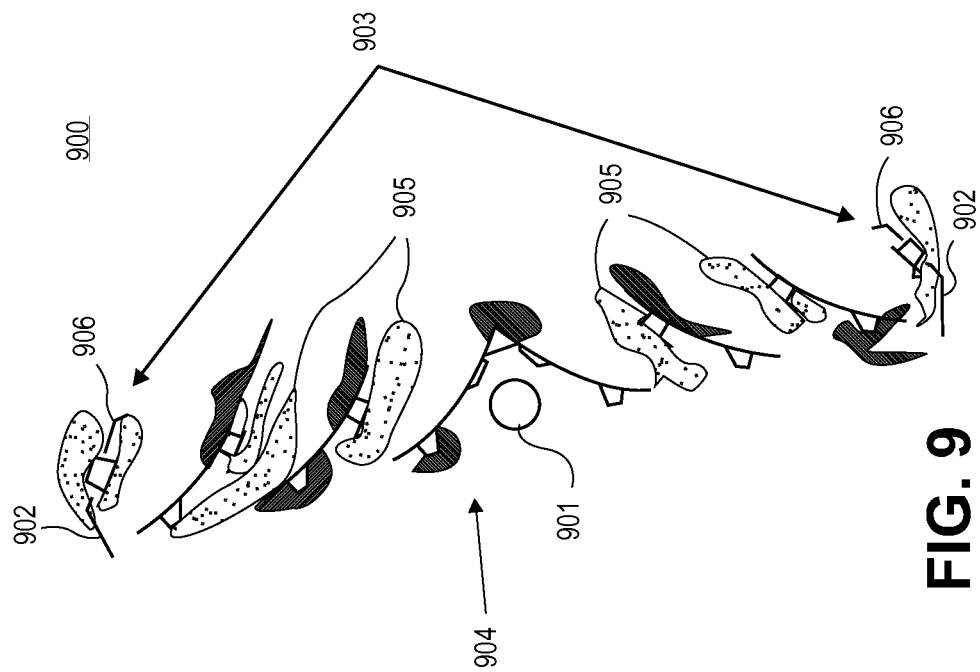
FIG. 9 shows an example of airflow speed simulation on an exemplary embodiment of a photovoltaic ("PV") system as depicted in FIG. 8.

FIG. 9 shows an example of airflow speed simulation on an exemplary embodiment of a photovoltaic ("PV") system as depicted in FIG. 8. As shown in FIG. 9, the field wind propagates in a direction of arrow 904 towards the PV system. The regions having an accelerated airflow are depicted in FIG. 9 as having a dotted pattern, and the regions of wind shadows are depicted as having a lined pattern. As shown in FIG. 9, the regions where the heat sinks of the edge row receivers coupled to lower edge row flow accelerators 902, upper edge row flow accelerators 906, or both are located, such as regions 903 have accelerated airflow. The speed of the airflow in the accelerated airflow regions is substantially higher than the speed of the airflow in the wind shadow regions. The speed of the airflow around interior receiver heat sinks (e.g., in regions 905) with interior row airflow accelerators (not shown) can be greater than the speed of the airflow around the interior receiver heat sinks of the PV system without the airflow accelerators, as depicted in FIG. 6.

Referring back to FIG. 8, each of the edge row flow accelerators 811 and 812 has a wind deflecting surface. The airflow is accelerated at the edge rows of the system by extending a wind deflecting surface of the airflow accelerator into the flow boundary around the system. The effect of the wind deflecting surface is to channel flow directly into the heat sink fins over a wide range of positions and wind directions so as to maintain a more uniform temperature across the entire array.

Figure 10:
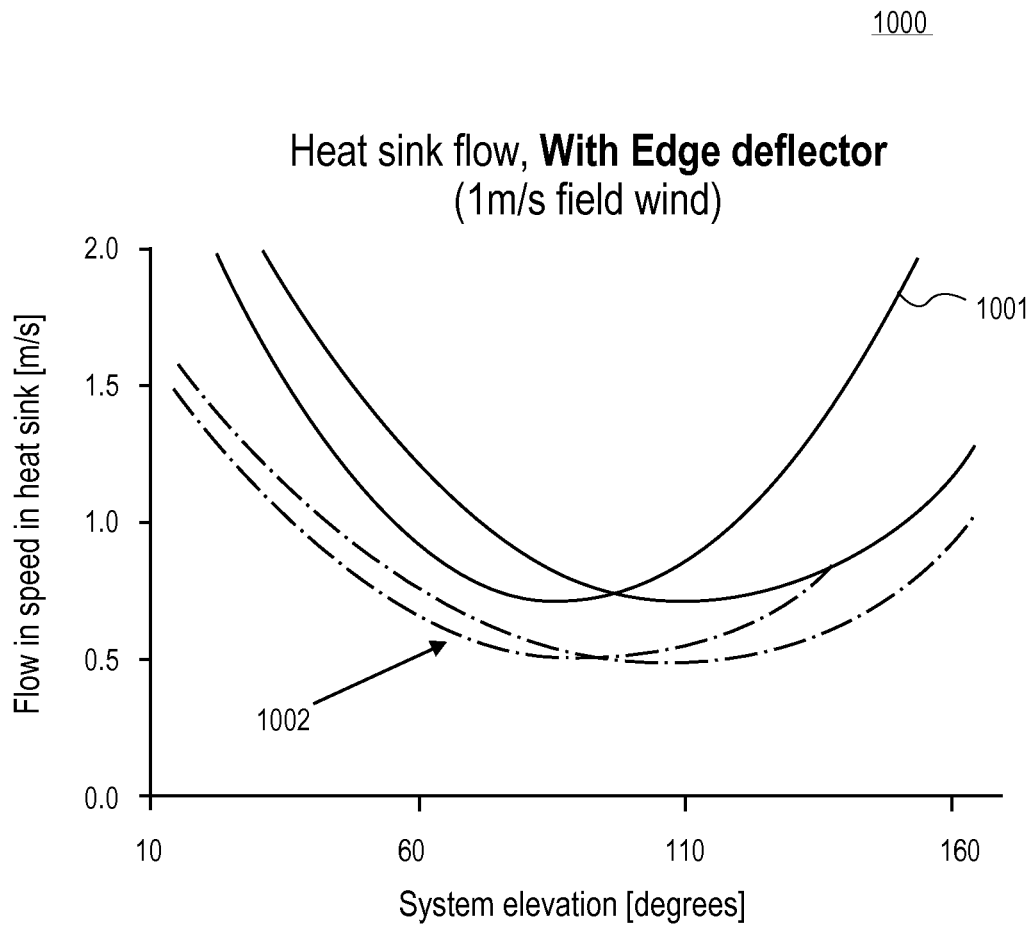
FIG. 10 shows an example of a graph of the simulated wind flow through the heat sinks of the exemplary embodiment of the PV system after the addition of the airflow accelerators, as depicted in FIG. 9.

FIG. 10 shows an example of a graph of the simulated wind flow through the heat sinks of the exemplary embodiment of the PV system after the addition of the airflow accelerators, as depicted in FIG. 9. The flow speed in the heat sinks is depicted as a function of an elevation angle of the system relative to a reference surface. The reference surface can be a ground surface. The simulation of the flow speed is performed at 1 m/s field wind. The flow speed in the heat sinks of the of edge row receivers 1002 is increased relative to the flow speed in the edge row receiver heat sinks without the flow accelerators. As shown in FIG. 10, the flow speed in the heat sinks of the of edge row receivers 1002 is substantially similar to the flow speed in the heat sinks of the interior receivers 1001 at any elevation of the system.

Figure 11A:
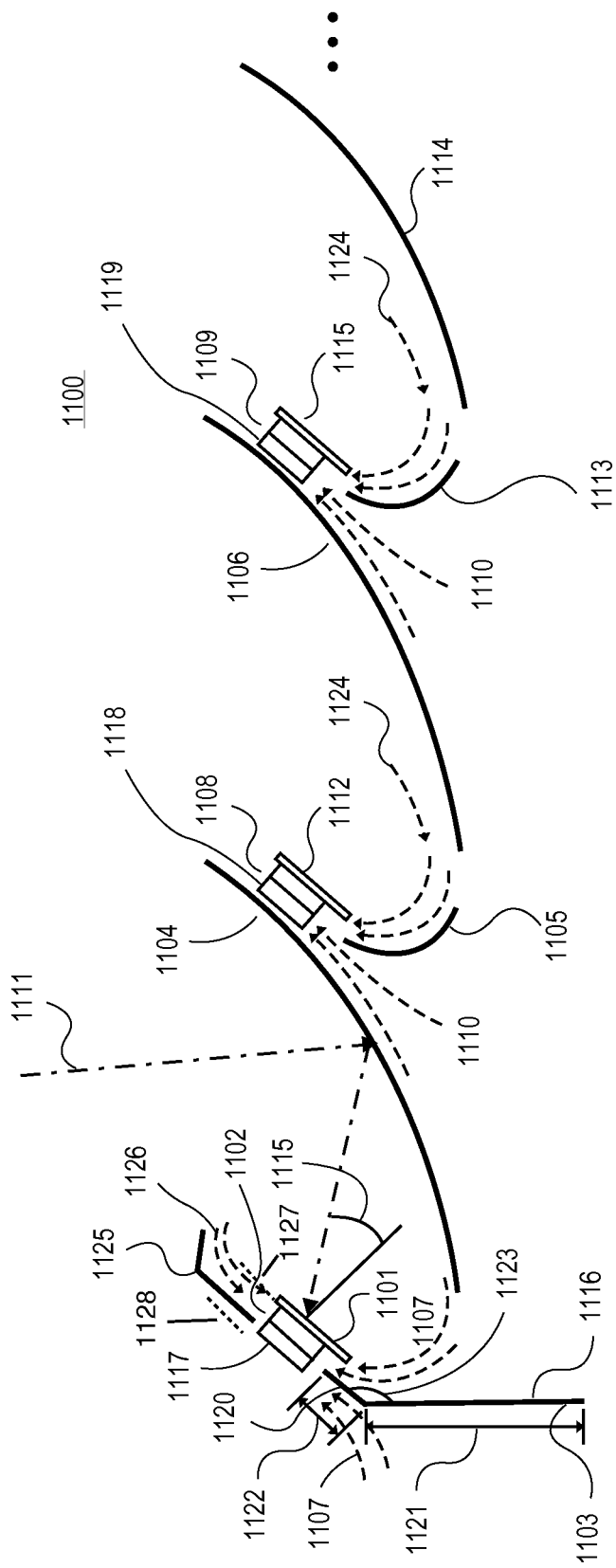
FIG. 11A shows a cross-sectional view of an exemplary embodiment of a portion of a photovoltaic ("PV") system having airflow accelerators at the edge rows and at the interior rows.

FIG. 11A shows a cross-sectional view 1100 of an exemplary embodiment of a portion of a photovoltaic ("PV") system having airflow accelerators at the edge rows and at the interior rows. As shown in FIG. 11A, the PV system has an array of linear concentrator optics 1104, 1106, and 1114, and PV receivers 1102, 1108, and 1109 having heat sinks 1117, 1118, and 1119 respectively. The PV receiver 1102 is an edge row receiver and receivers 1108 and 1109 are interior receivers. As shown in FIG. 11A, an lower edge row flow accelerator 1103 and an upper edge row flow accelerator 1125 are positioned at receiver 1102 located at the edge row of the system, and interior row flow accelerators 1105 and 1113 are positioned at the interior receivers 1108 and 1109 respectively. As shown in FIG. 11A, each of the heat sinks 1118 and 1119 is adjacent to a back surface of the linear concentrator optics 1104 and 1106 respectively. The edge row receiver 1102 is not attached to the linear concentrator optics.

As shown in FIG. 11A, lower edge row flow accelerator 1103 has a surface 1120 extending at an angle from a lower portion of receiver 1102 in one direction (e.g., downwards) to guide an airflow 1107 into heat sink 1117. Surface 1120 is positioned between a plane extending from a front side 1127 (e.g., a front glass) of the receiver and a plane extending from a back side 1128 (e.g., top surface of heat sink 1117) of receiver 1101 to guide airflow at both sides of the surface 1120 of the accelerator 1103 into heat sink 1117. For example, the surface of the flow accelerator can be oriented between the front glass of receiver and the top surface of the heat sink to maximize air flow acceleration over a wider range of system elevation angles.

Upper edge row flow accelerator 1125 has a surface extending at an angle from an upper portion of receiver 1102 in another direction (e.g., upwards) to guide an airflow 1126 into heat sink 1117. The surface of the upper edge row flow accelerator 1125 is positioned between a plane extending from front side 1127 and a plane extending from back side 1128 of receiver to guide airflow 1126 at both sides of the surface of the accelerator 1125 into heat sink 1117. Interior row flow accelerator 1105 has a surface extending from receiver 1108 to guide airflow 1110 onto heat sink 1118, and interior row flow accelerator 1113 has a surface extending from receiver 1109 to guide airflow 1110 into heat sink 1119. The surface of each of the interior row flow accelerator 1105 and 1113 is positioned between the back side and the front side of the respective receiver, as shown in FIG. 11A. The size, position, and angle of surface 1120 is adjusted to smoothly guide airflow 1110 into heat sink 1119 without abrupt direction changes and while minimizing the solar shadow extending beyond the receiver 1101. For example, the airflow acceleration (increase in the speed of the airflow and/or increase in the amount of the airflow) and torque load reduction can be boosted by increasing the size 1121 of the surface 1120 extending further from the heat sink 1117. In at least some embodiments, the size 1122 is in the approximate range of 20 millimeters ("mm") to 50 millimeters. And may consist of a series of consecutive bends to produce a progressive curve to the surface.

As shown in FIG. 11A, edge row airflow accelerator 1103 has a surface 1116 (e.g., a plate) adjacent to a surface 1120 (e.g., a plate). The surface 1116 is positioned relative to the surface 1120 at an angle 1123. In at least some embodiments, the length and angle of surface 1120 is defined relative to the sun to minimize the shadow size beyond the receiver 1102. In at least some embodiments, the angle between the surfaces 1120 and 1116 is adjusted to maximize the airflow acceleration through heat sink 1117 and at the same time to minimize the shadow and pressure drop of airflow moving along the flow accelerator. In at least some embodiments, angle 1123 depends on the receiver orientation relative to the whole system support conditions. In at least some embodiments, angle 1123 is greater than 90 degrees. In at least some embodiments, the angle between the surface 1116 and 1120 is in an approximate range of 90 to 135 degrees.

The size and position of surface 1116 is adjusted to redirect the airflow 1107 that otherwise bypasses the receiver 1102 towards the surface 1120 and 1116. For example, the airflow acceleration (increase in the speed of the airflow and/or increase in the amount of the airflow) and torque load reduction can be boosted by increasing the size 1121 of the surface 1116 extending further from the receiver. In at least some embodiments, the size 1121 of the surface is adjusted to provide the airflow speed through the edge heat sink that matches to the airflow speed through an interior row receiver heat sink. In at least some embodiments, the size of the surface of the airflow accelerator extending from the receiver is limited by a clearance of the system to the ground, for example, when the system rotates to a position close to orthogonal to the ground. In at least some embodiments, the size 1121 is in the approximate range of 50 millimeters ("mm") to 200 millimeters.

Inner row airflow accelerators, such as accelerators 1105 and 1113 are configured to maximize airflow through the heat sinks 1118 and 1119 respectively. In at least some embodiments, the surface of the airflow accelerator 1105 deflects the airflow 1110 that otherwise passes between the optics 1106 and light receiving front portion 1112 (e.g., one or more solar cells) towards heat sink 1118. Additionally at other elevation angles the air flow accelerator 1105 and 1113 deflects air flow 1124 that would propagate along optics 1106 and 1114 into heat sink 1118 and 1119 respectively.

The surface of the airflow accelerator 1113 deflects the airflow 1110 that otherwise passes between the optics 1114 and light receiving front portion 1115 (e.g., cell) toward heat sink 1119. The size and shape of the surfaces of the airflow accelerators can be optimized to provide a uniform and maximum flow speed for all heat sinks of the system.

In at least some embodiments, each of the linear concentrator optics 1104, 1106, and 1114 is a curved (e.g., parabolic) mirror. The linear concentrator optics is configured to concentrate sun light onto the light receiving portion of the respective receiver (e.g., one or more solar cells). Light (not shown) can be reflected from the front surface of the optics 1106 to concentrate onto receiving portion 1112 (e.g., one or more solar cells) of the opposite interior receiver 1108. Light (not shown) can be reflected from the front surface of the optics 1114 to concentrate onto receiving portion 1115 (e.g., one or more solar cells) of the opposite interior receiver 1109.

As shown in FIG. 11A, a portion 1101 (e.g., one or more solar cells) of edge row receiver 1102 receives light 1111 reflected from a front surface of the optics 1104. As shown in FIG. 11A, edge row receiver 1102 is not attached to the optics. The edge row receiver having heat sink 1102 can be attached to a vertical support (not shown) mounted on a strut (not shown), as described above. The PV system has a rotational member (not shown) configured to rotate the concentrator optics, such as optics 1104, 1106, and 1114, receivers, such as receivers 1102, 1108, and 1109, and airflow accelerators, such as edge row flow accelerator 1103, and interior flow accelerators 1105 and 1113 into alignment with the sun, so that an incident angle, such as incident angle 1115, of the light concentrated by the optics onto the receivers remains constant, as described above.

Because the power output of concentrator PV system is highly dependent on the system remaining in good alignment with the sun, any wind loads that cause the system to deflect or twist must be accounted for in the system design. High wind torque loads result in a twisting of the system along its rotational axis and thus require more robust structural elements and in turn higher costs due to additional material requirements.

Figure 11B:
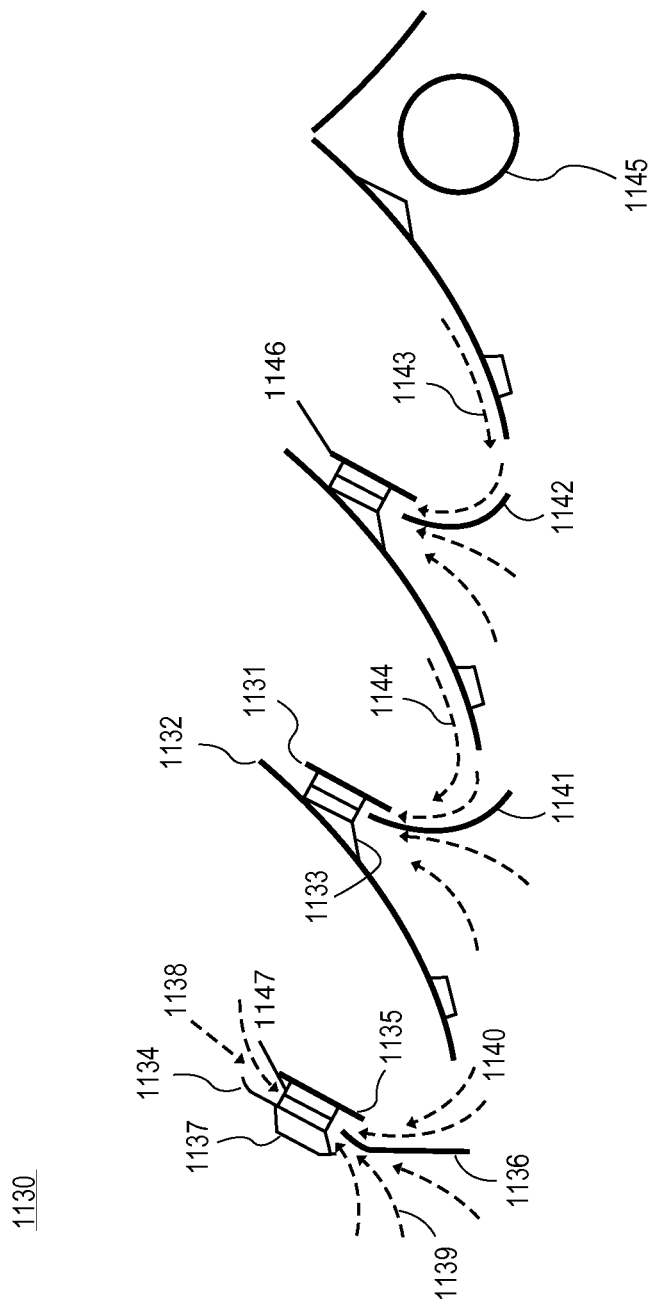
FIG. 11B shows a cross-sectional view of another exemplary embodiment of a portion of a photovoltaic ("PV") system having airflow accelerators at the edge rows and at the interior rows.

FIG. 11B shows a cross-sectional view 1130 of another exemplary embodiment of a portion of a photovoltaic ("PV") system having airflow accelerators at the edge rows and at the interior rows. As shown in FIG. 11B, a lower edge row flow accelerator 1136 and an upper edge row flow accelerator 1134 are positioned at receiver 1135 located at the edge row of the system, and interior row flow accelerators 1141 and 1142 are positioned at the interior receivers 1131 and 1146 respectively, as described above. As shown in FIG. 11B, the heat sink of each of the interior row receivers is attached to a stiffening feature on a back surface of the linear concentrator optics. For example, as shown in FIG. 11B, the heat sink of the interior row receiver 1131 is attached to a stiffening feature 1133 on the back surface of the linear concentrator optics 1132. The edge row receiver 1135 is supported by a horizontal support 1137 and is not attached to any linear concentrator optics, as described above. The system has a rotational member 1145, as described above.

As shown in FIG. 11B, lower edge row flow accelerator 1136 has a surface extending at an angle from one side of receiver 1135 in one direction (e.g., downwards) to guide the airflow into heat sink 1147. As shown in FIG. 11B, the surface of airflow accelerator 1136 is positioned between a front side and a back side of receiver 1135 to guide airflow 1139 at one side of the accelerator 1136 and airflow 1140 at the other side of the accelerator 1136 into the heat sink.

As shown in FIG. 11B, upper edge row flow accelerator 1134 has a surface extending at an angle from an opposite side of receiver 1135 in another direction (e.g., upwards). The surface of the upper edge row flow accelerator 1134 can be positioned between the front side and the back side of the receiver 1135 to guide airflow 1138 at both sides of the accelerator 1134 into the heat sink. The surface of each of the interior row flow accelerators 1141 and 1142 is positioned between the back side and the front side of the respective receiver to guide the airflow propagating along the optics at one side of the accelerator (e.g., airflow 1144 and airflow 1143 respectively) and the airflow at an opposite side of the accelerator into the heat sink, as shown in FIG. 11B.

Figure 12:
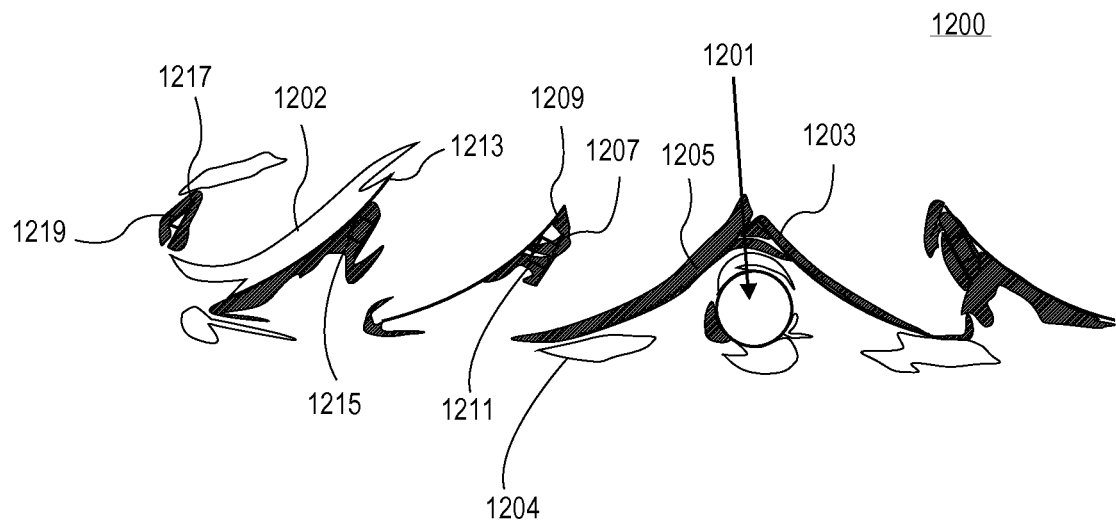
FIG. 12 shows an example of airflow distribution simulation on an exemplary embodiment of a photovoltaic ("PV") system without airflow accelerators.

FIG. 12 shows an example of airflow distribution simulation on an exemplary embodiment of a photovoltaic ("PV") system without airflow accelerators. The system has a rotational member 1201, concentrator optics, such as mirrors 1203, 1205, 1209, and 1213, interior row receivers, such as receivers 1215, and 1207, and edge row receivers, such as a receiver 1217, as described above with respect to FIG. 5. As shown in FIG. 12, the airflow is non-symmetrically distributed along the system. Some regions of the system, such as regions 1202 and 1204 depicted as having blank pattern, have the airflow greater than the other regions of the system, such as regions 1219 and 1215 depicted as having a lined pattern. More specifically, the airflow around edge mirror 1213 is much greater than the airflow in other portions of the system. Substantially non-symmetrical deflection of airflow by the edge mirror 1213 causes development of large torque forces at rotational member 1201, as shown in FIG. 12.

Figure 13:
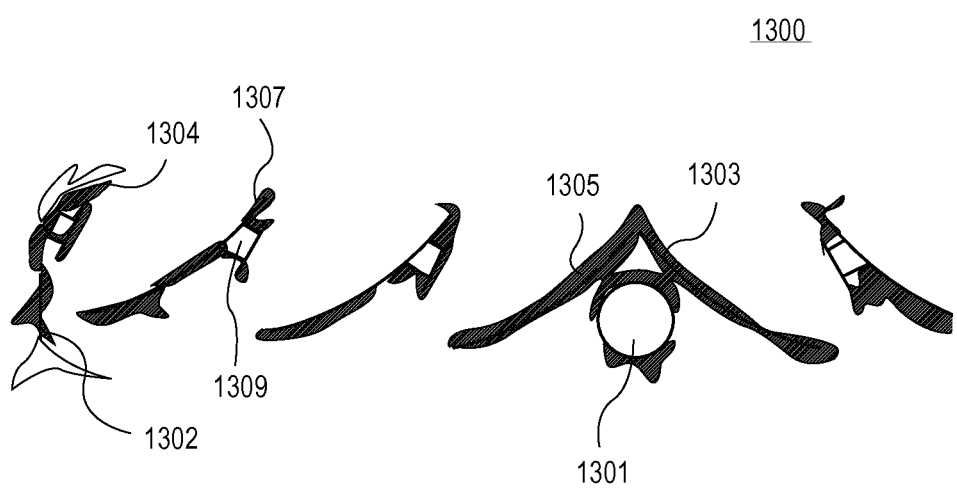
FIG. 13 shows an example of airflow distribution simulation on an exemplary embodiment of a photovoltaic ("PV") system with edge airflow accelerators.

FIG. 13 shows an example of airflow distribution simulation on an exemplary embodiment of a photovoltaic ("PV") system with edge airflow accelerators. The system has a rotational member 1301 to provide a rotational axis, concentrator optics, such as mirrors 1307, 1305, and 1303, interior row receivers, such as a receiver 1309, and edge row receivers, such as a receiver 1304, and edge row airflow accelerators, such as an accelerator 1302, as described above with respect to FIG. 8.

As shown in FIG. 13, the airflow is distributed along the system substantially symmetrically. Some regions of the system, such as regions at receiver 1304 and accelerator 1302 depicted as having a blank pattern, have the airflow greater than the other regions of the system, such as regions depicted as having a lined pattern. Deflection of the airflow by the surface of the edge row airflow accelerator 1302 causes substantially symmetrical distribution of airflow around the system. Due to symmetrical distribution of the airflow very low torque forces develop at the rotational member 1301, as shown in FIG. 13. That is, the PV system having at least one airflow accelerator causes reduction in torque and other wind loads acting on the PV system. According to the simulation, the use of airflow accelerator in the PV system reduces torque loads by over 50%.

Figure 14:
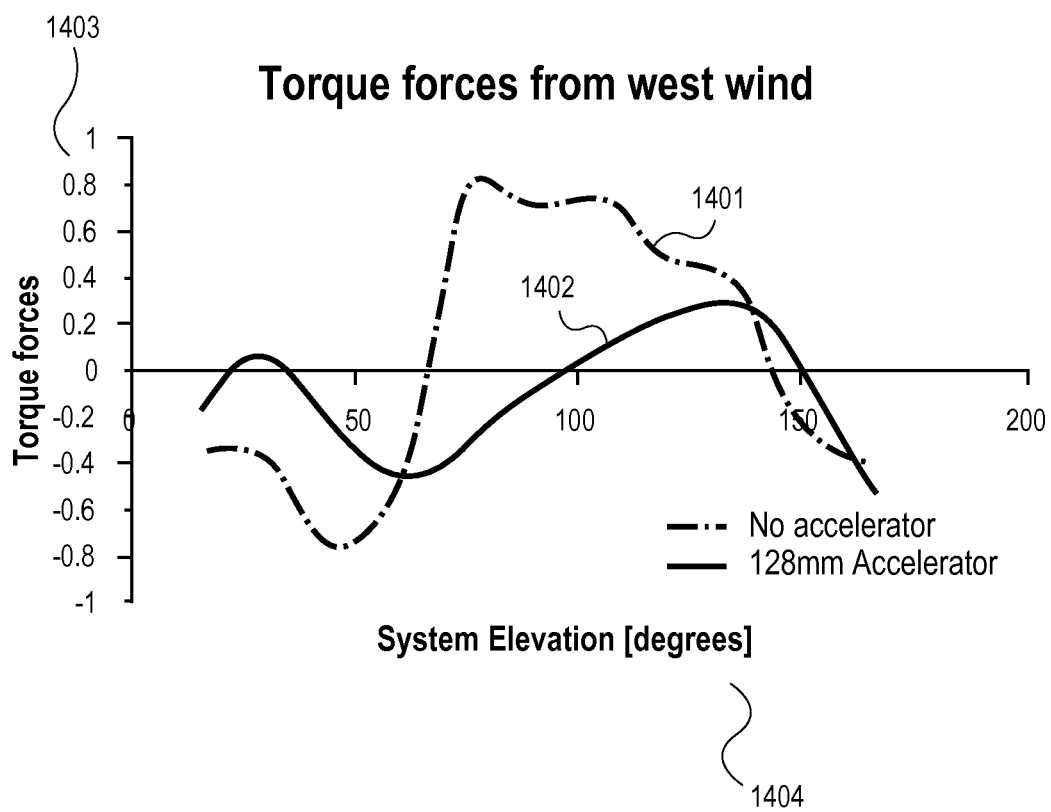
FIG. 14 shows an example of a graph of the simulated torque forces acting upon an exemplary embodiment of a PV system.

FIG. 14 shows an example of a graph of the simulated torque forces acting upon an exemplary embodiment of a PV system. A torque force 1403 (in arbitrary units) is depicted as a function of an elevation 1404 of the PV system relative to a reference surface (in degrees). The reference surface can be a ground surface. The torque forces can be simulated from west wind, as shown in FIG. 14. The torque load of a system having an airflow accelerator with an airflow deflecting surface length of about 128 millimeters ("mm") at a range of rotational positions is depicted as a solid line 1402. The torque load of a system without an airflow accelerator at a range of rotational positions is depicted as a dotted dash line 1401. As shown in FIG. 14, the torque load of the system with an airflow accelerator is smaller than the torque load of the system without the airflow accelerator over a range of rotational positions (elevations).

FIG. 15 is a flowchart of an exemplary embodiment of a method 1500 to provide a system to accelerate airflow into a heat exchanger. Method 1500 begins with operation 1501 involving coupling one or more optical elements (e.g., linear concentrator optics) to optoelectronic devices (e.g., receivers) having heat exchangers (e.g., heat sinks). At operation 1502 one or more airflow accelerators are coupled to the optoelectronic devices to increase a speed of an airflow into the heat exchangers, as described above. In at least some embodiments, an airflow accelerator can be coupled to an optoelectronic device positioned at an edge row of the photovoltaic system, as described above. In at least some embodiments, an airflow accelerator can be coupled to an optoelectronic device positioned at an interior row, as described above. In at least some embodiments, coupling the one or more airflow accelerators involves mounting the airflow accelerator to a support that holds the optoelectronic device, as described above. The positions of the one or more airflow accelerators relative to the respective optoelectronic devices are fixed, as described above.

At operation 1503 a rotational member (e.g., a torque tube) is coupled to rotate the optoelectronic devices, the optical elements, and the airflow accelerators, as described above. At operation 1504 one or more struts are coupled to the optoelectronic devices, as described above. Next, operation 1505 involving guiding airflow by the airflow accelerators towards respective heat exchangers is performed. In at least some embodiments, the airflow accelerator has a surface extending from the respective receiver, as set forth above. In at least some embodiments, the airflow accelerator has a surface extending from a heat exchanger of the receiver. In at least some embodiments, the airflow is deflected by the surface of the airflow accelerator towards the heat sink. At operation 1504 one or more wind loads are reduced by using the one or more airflow accelerators, as set forth above with respect to FIGS. 12-14.

In the foregoing specification, embodiments of the invention have been described with reference to specific exemplary embodiments thereof. It will be evident that various modifications may be made thereto without departing from the broader spirit and scope of the invention. The specification and drawings are, accordingly, to be regarded in an illustrative sense rather than a restrictive sense.

What is claimed is:

1. An apparatus to increase a speed of an airflow through a heat exchanger, comprising:
   a support frame;
   a first curved optical element supported by the support frame, the first curved optical element having a front reflective side, a back side, a top edge, and a bottom edge;
   a second curved optical element having a top edge and a bottom edge, wherein the top edge of the first curved optical element is spaced apart from the top edge of the second curved optical element, and wherein the bottom edge of the first curved optical element is spaced apart from the bottom edge of the second curved optical element,
   wherein the first and second curved optical elements are exposed to the atmosphere and natural wind currents;
   an optoelectronic device mechanically coupled to the second curved optical element, the optoelectronic device comprising a heat exchanger and a solar receiver, the solar receiver having a first side configured to receive solar energy and a second opposite side connected to the heat exchanger, the heat exchanger including an air flow passage configured to allow a flow of air to pass through the heat exchanger on the second side of the solar receiver and in at least upward and downward directions, the optoelectronic device mounted relative to the first curved optical element such that light reflected off of the front reflective side is directed to the first side of the solar receiver; and
   an airflow accelerator supported by the support frame and mechanically coupled to the optoelectronic device, wherein the airflow accelerator comprises a first surface configured to guide the airflow towards the heat exchanger, the airflow accelerator configured to guide at least a portion of the airflow through a space between the second curved optical element and the optoelectronic device.

2. The apparatus of claim 1, wherein the airflow accelerator comprises a second surface coupled to the first surface, wherein the second surface is adapted to redirect the airflow that bypasses the optoelectronic device towards the first surface.

3. The apparatus of claim 1, wherein the top and bottom edges of the first curved optical element are free edges, and wherein the top and bottom edges of the second curved optical element are free edges.

4. The apparatus of claim 1, wherein the airflow accelerator comprises a metal, a plastic, a glass, or any combination thereof.

5. The apparatus of claim 1, wherein the airflow accelerator is mounted to a support that holds the optoelectronic device.

6. The apparatus of claim 1, wherein the airflow accelerator comprises a bent sheet of metal.

7. The apparatus of claim 1, wherein at least a portion of the airflow accelerator extends above the optoelectronic device and is positioned to provide a shade to a back of the optoelectronic device.

8. The apparatus of claim 1, wherein at least a portion of the airflow accelerator extends below the optoelectronic device.

9. A photovoltaic ("PV") system to accelerate an airflow into one or more heat exchangers, comprising:
   one or more first rows of receivers;
   one or more second rows of curved optical elements adapted to concentrate light onto the receivers;
   one or more third rows of airflow accelerators mechanically coupled to the one or more first rows of receivers to increase the speed of airflow through the one or more heat exchangers; and
   one or more fourth rows of curved optical elements, the receivers coupled to back sides of the one or more fourth rows of the curved optical elements such that the one or more heat exchangers are disposed between the receivers and the one or more fourth rows of the curved optical elements, the one or more fourth rows of curved optical elements spaced apart from the one or more second rows of curved optical elements,
   wherein the one or more second rows of curved optical elements and the one or more fourth rows of curved optical elements are exposed to the atmosphere and natural wind currents, and
   wherein the one or more third rows of airflow accelerators are configured to guide at least a portion of an airflow through a space between the one or more fourth rows of curved optical elements and the one or more first rows of receivers.

10. The PV system of claim 9, wherein the airflow accelerators comprise surfaces extending from the respective receivers to collect the airflow that bypasses the receivers.

11. The PV system of claim 9, wherein the airflow accelerators include an airflow accelerator coupled to a receiver positioned at an edge row.

12. The PV system of claim 9, wherein the airflow accelerators include an airflow accelerator coupled to a receiver positioned at an interior row.

13. The PV system of claim 9, wherein positions of the airflow accelerators relative to the respective receivers are fixed.

14. The PV system of claim 9, wherein the airflow accelerators comprise a metal, a plastic, a glass, or any combination thereof.

15. The PV system of claim 9, wherein the airflow accelerators are mounted to supports that hold the respective receivers.

16. The PV system of claim 9, wherein the airflow accelerators are mounted to supports that hold the respective optical elements.

17. The PV system of claim 9, wherein the airflow accelerators comprise bent sheets of metal.

18. The apparatus of claim 1, wherein the optoelectronic device is attached to a back side of the second curved optical element such that the heat exchanger is disposed between the solar receiver and the second curved optical element such that air flowing through the heat exchanger flows between the solar receiver and the back side of the second curved optical element, wherein the second curved optical element extends along a longitudinal direction, wherein the airflow accelerator extends in a longitudinal direction generally parallel to the second curved optical element and has a first end coupled to the optoelectronic device and a second end that bends away from the second curved optical element and toward a lower end of the first optical element, so as to divert a flow of air, which flows downwardly along the first curved optical element, upwardly toward the optoelectronic device.

19. The apparatus of claim 1, wherein the airflow accelerator is disposed between the first curved optical element and the second curved optical element, and wherein the airflow accelerator is configured to deflect an airflow that otherwise passes between the first curved optical element and the solar receiver through the heat exchanger.

20. The apparatus of claim 1, wherein the apparatus is configured such that at least a portion of the airflow passes between the top edge of the first curved optical element and the top edge of the second curved optical element from outside the apparatus or between the bottom edge of the first curved optical element and the bottom edge of the second curved optical element from outside the apparatus.

21. The apparatus of claim 1, wherein the first curved optical element and the second curved optical element are not disposed inside a closed housing.

22. The apparatus of claim 1, wherein the airflow accelerator comprises a fixed end coupled to the optoelectronic device and a free end extending away from the optoelectronic device.

23. The PV system of claim 9, wherein the system is configured such that at least a portion of the airflow passes from the atmosphere between the one or more second rows of curved optical elements and the one or more fourth rows of curved optical elements.

24. The apparatus of claim 1, wherein the second curved optical element is curved to define a first concave surface, wherein the airflow accelerator comprises a second concave surface, wherein the first concave surface and the second concave surface face away from one another.

25. The apparatus of claim 1, wherein the airflow accelerator is configured to guide at least a portion of the airflow through a space between the second curved optical element and the airflow accelerator.

26. The apparatus of claim 1, wherein the airflow accelerator is separate from and angled relative to the second curved optical element.

* * * * *